United States Patent [19]
Kizuki

[11] Patent Number: 5,608,749
[45] Date of Patent: Mar. 4, 1997

[54] SEMICONDUCTOR LASER DIODE AND SEMICONDUCTOR LASER DIODE ARRAY INCLUDING PLATED HEAT SINK (PHS) ELECTRODE

[75] Inventor: Hirotaka Kizuki, Itami, Japan

[73] Assignee: Mitsubishi Denki Kabushiki Kaisha, Tokyo, Japan

[21] Appl. No.: 94,223

[22] Filed: Jul. 21, 1993

[30] Foreign Application Priority Data

Sep. 16, 1992 [JP] Japan .................................. 4-273585
Jan. 25, 1993 [JP] Japan .................................. 5-009921

[51] Int. Cl.⁶ .................................................. H01S 3/04
[52] U.S. Cl. ............................... 372/36; 372/43; 372/50
[58] Field of Search ............................ 372/34, 35, 36, 372/43, 50

[56] References Cited

U.S. PATENT DOCUMENTS

| | | | |
|---|---|---|---|
| 3,896,473 | 7/1975 | DiLorenzo et al. | 372/36 |
| 4,161,701 | 7/1979 | Takeda et al. | 372/36 |
| 4,210,878 | 1/1980 | Yonezu | 331/94.5 |
| 4,340,900 | 7/1982 | Goronkin | 357/56 |
| 4,740,977 | 4/1988 | Ikeda | 372/45 |
| 4,856,015 | 8/1989 | Matsui et al. | 372/36 |
| 4,949,346 | 8/1990 | Kuper et al. | 372/36 |
| 4,994,142 | 2/1991 | Applebaum | 156/647 |
| 5,008,737 | 4/1991 | Burnham et al. | 372/36 X |
| 5,016,083 | 5/1991 | Ishii et al. | 372/36 |
| 5,043,291 | 8/1991 | Devoldere et al. | 437/24 |
| 5,313,483 | 5/1994 | Kozlovsky et al. | 372/36 X |

FOREIGN PATENT DOCUMENTS

| | | |
|---|---|---|
| 0364155 | 10/1988 | European Pat. Off. . |
| 57-27090 | 2/1982 | Japan . |
| 57-27092 | 2/1982 | Japan . |
| 57-199286 | 12/1982 | Japan . |
| 210786 | 1/1990 | Japan . |
| 231478 | 2/1990 | Japan . |
| 2263491 | 10/1990 | Japan . |
| 1065459 | 12/1963 | United Kingdom . |
| 2101045 | 6/1982 | United Kingdom . |
| 2178595 | 2/1987 | United Kingdom . |
| 8601367 | 5/1985 | WIPO . |
| 8909505 | 10/1989 | WIPO . |

*Primary Examiner*—Akm E. Ullah
*Assistant Examiner*—Hemang Sanghavi
*Attorney, Agent, or Firm*—Leydig, Voit & Mayer

[57] ABSTRACT

A semiconductor laser diode having a selective PHS structure includes a semiconductor substrate having opposite first and second main surfaces, a laser diode structure disposed on the first main surface, and a PHS electrode selectively buried in the second main surface wherein the laser diode structure is located in an area defined by a first pair of parallel lines running in a direction perpendicular to a resonator length direction and a second pair of parallel lines located at the side surfaces of the semiconductor substrate, the first pair of lines being located internally of front and rear facets of the semiconductor substrate, and the PHS electrode has a length in the resonator length direction no shorter than the active region in the resonator length direction. The heat radiating characteristic is improved, especially at the laser beam emitting facet.

4 Claims, 18 Drawing Sheets

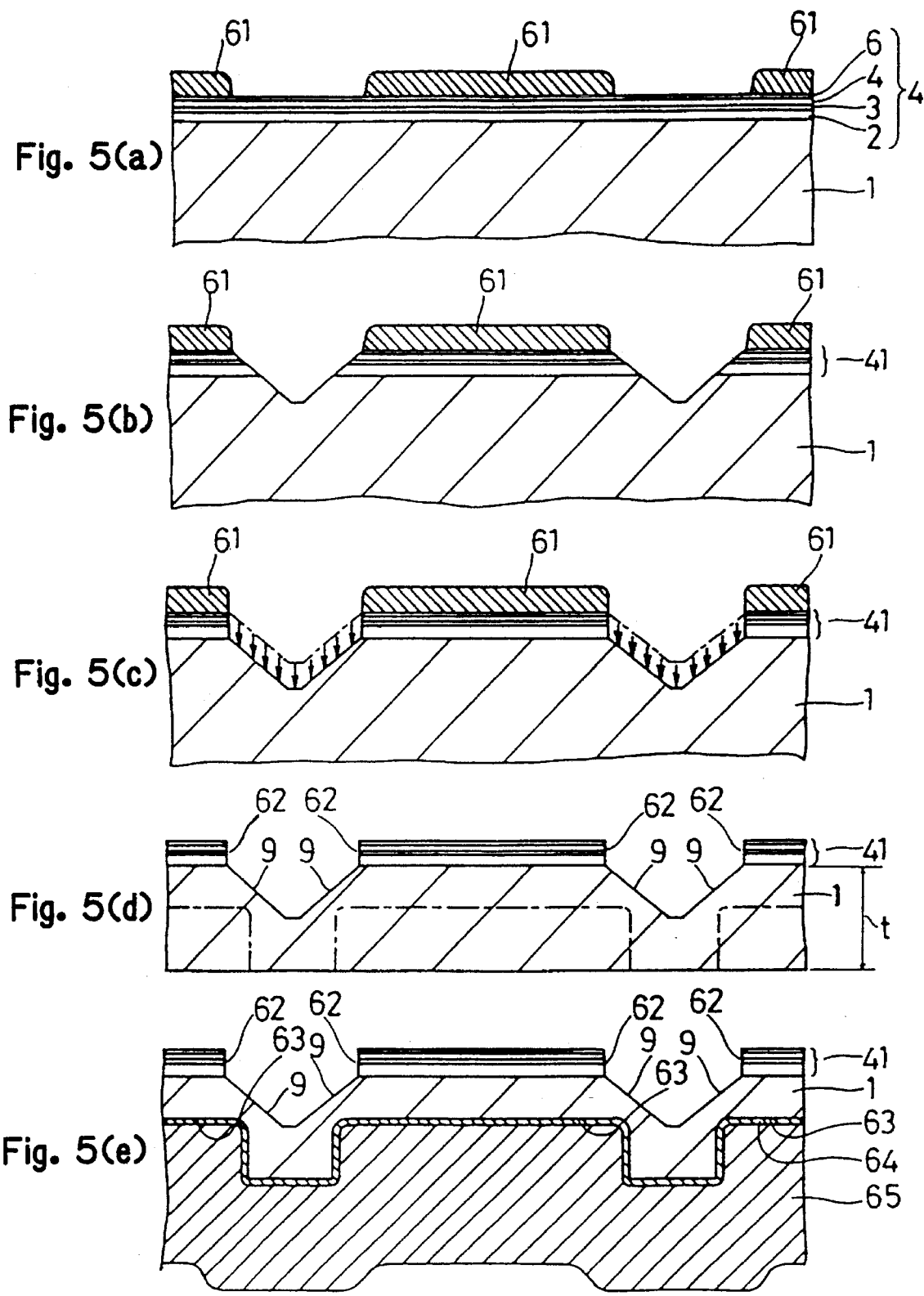

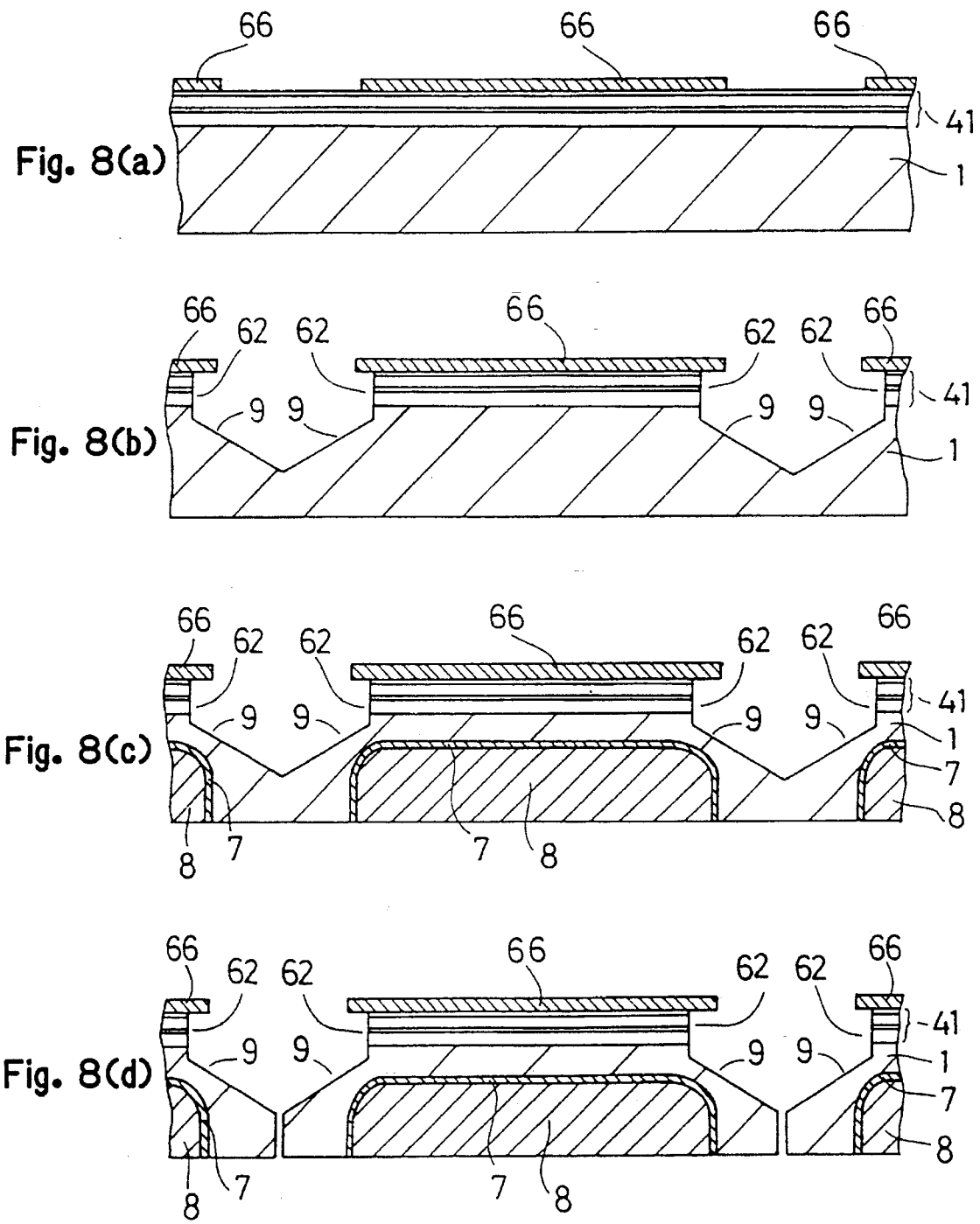

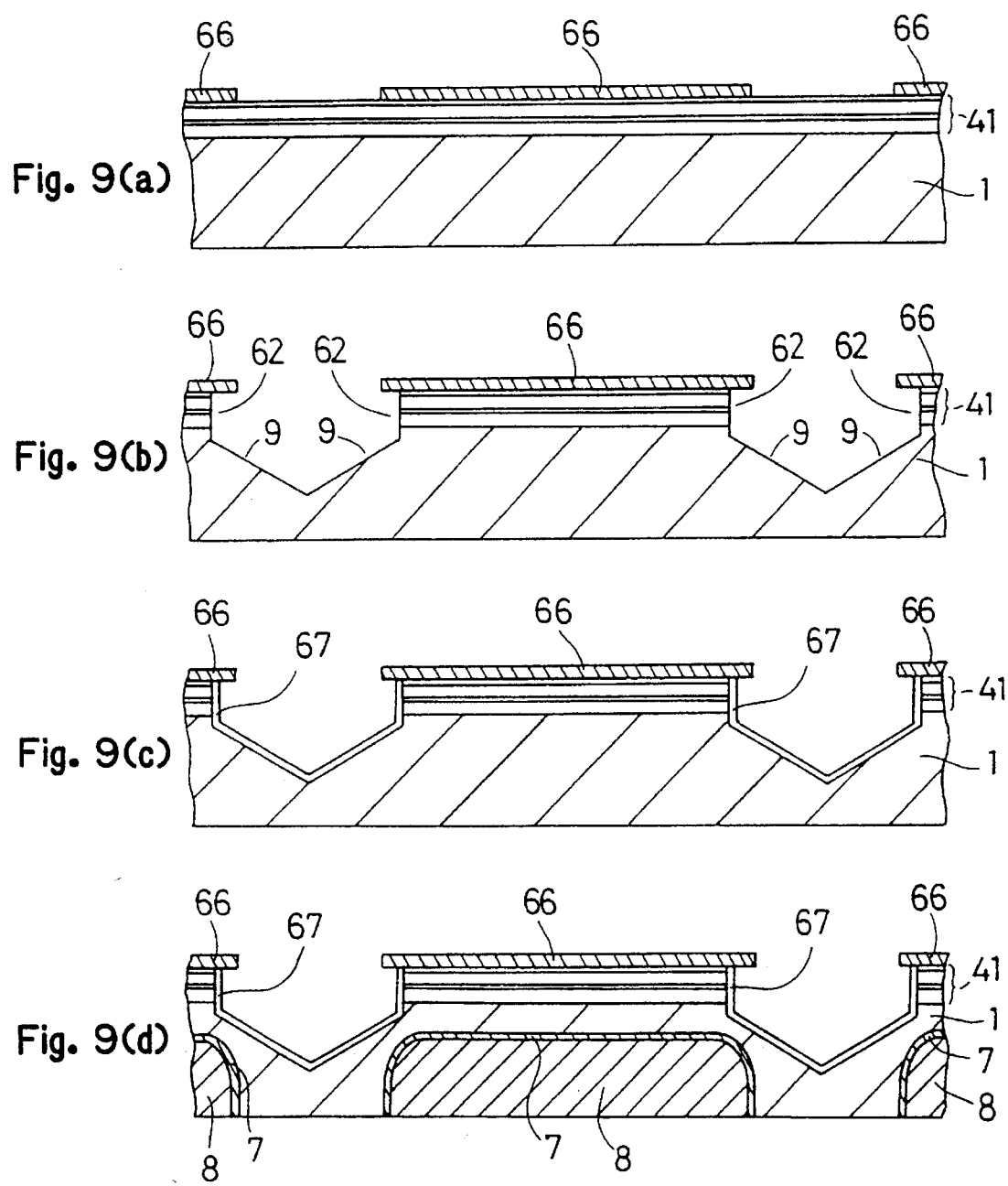

SEMICONDUCTOR LASER DIODE AND SEMICONDUCTOR LASER DIODE ARRAY INCLUDING PLATED HEAT SINK (PHS) ELECTRODE

FIELD OF THE INVENTION

The present invention relates to a semiconductor laser diode including a plated heat sink (hereinafter referred to as PHS) electrode selectively buried in a substrate and a method of producing the semiconductor laser diode.

BACKGROUND OF THE INVENTIONS

Recently, a semiconductor laser diode is required to have high performances such as high power or long lifetime. Particularly, a multi-channel optical disc device has been developed as a large capacity and high speed information storing device of the next generation. Therefore, raising of the performance of a multi-beam semiconductor laser diode as a key device has been given attention. Under these circumstances, a laser diode with a PHS structure for improving the heat radiating characteristic and reducing mechanical and thermal stress during mounting, is proposed as means for raising the performance of the laser diode.

FIG. 17 shows a semiconductor laser diode having a PHS electrode, which is disclosed, for example, in Japanese Published Patent Application No.57-199286. A multi-layer epitaxial layer 101 which becomes an active region of the laser is disposed on an n-type GaAs substrate 100, a p-side ohmic electrode 102 is disposed on the multi-layer epitaxial layer 101 and a PHS electrode 106 is disposed on the p-side ohmic electrode 102. Further, an n-side ohmic electrode 103 is disposed on a rear surface of the substrate 100.

This laser diode is fabricated with the condition that the multi-layer epitaxial layer 101 side is adhered to a mount base in assembling the laser diode on the mount base, a so-called junction-down mounting. For this purpose, the PHS electrode 106 is formed on the multi-layer epitaxial layer 101 via the p-side ohmic electrode 102. The PHS electrode is provided so as to improve the thermal characteristic of the laser by rapidly diffusing heat which is generated in operating the laser and so as to reduce the mechanical and thermal stress in assembly. Gold plating with good heat conductivity and high durability is conventionally employed as material of the PHS electrode 106.

Brief description will be given of the reason why this laser diode has such complicated structure as shown in FIG. 17.

It has been known that optical density in a semiconductor laser diode is the highest at a light emitting facet. Therefore, the temperature rise is the largest in the vicinity of the light emitting facet and particularly, in high power output operation, the temperature rise and the increase in optical absorption occur interactively, and in the worst case, the facet is damaged. It is also reported that, when the PHS electrode is formed within the area of the multi-layer epitaxial layer, thermal and mechanical stress remains in edge parts of the PHS electrode 106, resulting in the characteristics deterioration (for example, Japanese Published Patent Application No.57-27090). Because of these two problems, the PHS electrode 106 as a radiator is desired to cover the whole surface of the multi-layer epitaxial layer 101 which becomes the active region of the laser diode. However, since gold as a material for the PHS electrode 106 is superior in its durability it is difficult to apply gold to a process in which the PHS electrode 106 is previously formed on the whole surface of a wafer and the facet is formed by cleaving as is conventional.

Therefore, this prior art device is produced in accordance with a process of FIGS. 18(a) to 18(e). More particularly, first, as illustrated in FIG. 18(a), crystal growth is carried out to produce the multi-layer epitaxial layer 101 on the substrate 100, the n-side ohmic electrode 103 is formed on the rear surface of the substrate 100 and the p-side ohmic electrode 102 is formed on the multi-layer epitaxial layer 101. Secondly, a mask pattern is formed on the p-side ohmic electrode 102, and after the facets are formed by wet etching (FIGS. 18(b) and 18(c)), a photoresist 105 is deposited on the whole surface of the wafer. The photoresist 105 is patterned so that the whole surfaces of the respective multi-layer epitaxial layers 101 may be bottom surfaces of respective openings and the openings may be broadened in reverse trapezoidal shapes in cross-section (FIG. 18(d)), and thereafter, the PHS electrode 106 is formed so as to fill in the spaces of the trapezoidal shape with gold. Thereafter, the completed laser diodes are obtained by dividing the wafer into chips. Here, this prior art laser diode has such a complicated structure as shown in FIG. 17, because the PHS electrode 106 has an upper end that is broader not only in the resonator length direction but also in the device width direction than the lower end thereof, and the multi-layer epitaxial layer 101 is produced by etching not only resonator facet portions but also side surface portions of the devices.

A description is given of a second prior art semiconductor laser diode having a PHS electrode.

FIG. 19 is a perspective view showing a structure of the prior art semiconductor laser diode of selective PHS structure having a PHS electrode selectively buried in the rear surface side of a semiconductor substrate. In the figure, an n-type $Al_xGa_{1-x}As$ first cladding layer 2 is disposed on an n-type GaAs substrate 1, a p-type $Al_yGa_{1-y}As$ active layer 3 is disposed on the first cladding layer 2 and a p-type $Al_xGa_{1-x}As$ second cladding layer 4 is disposed on the active layer 3. A portion of the second cladding layer 4 is formed in a stripe shape ridge by etching. An n-type GaAs current blocking layer 5 is disposed on both sides of the striped ridge of the second cladding layer 4 to bury the stripe ridge, and a p-type GaAs contact layer 6 is disposed on the current blocking layers 5 and the stripe ridge. A concave part is produced on the rear surface of the substrate 1, and an n-side ohmic electrode 7 is provided on the internal wall of the concave part. The concave part on the rear surface of the substrate 1 is filled with a PHS electrode 8. Further, reference numeral 10 designates a thickness from the substrate facet to the side surface of the PHS electrode 8 (hereinafter referred to as facet thickness), numeral 11 designates a thickness from the active layer 4 to the side surface of the PHS electrode 8 (hereinafter referred to as remaining substrate thickness), and numeral 14 designates an emitted laser beam.

In this second prior art device, differently from the first prior art device, it is a feature that the laser diode is fabricated such that the PHS electrode 8 is selectively buried in the rear surface of the substrate 1. This second prior art laser diode is fabricated with the condition that the substrate 1 side is adhered to a mount base in assembling the laser diode on the mount base, so-called junction-up mounting. In order to improve the heat radiating characteristic in the selective PHS structure, the remaining substrate thickness 11 is desired to be as thin as possible, i.e., to be below 20 μm. In addition, in order to increase the heat radiating characteristic in the vicinity of the laser emitting facet, the facet thickness 10 is desired to be as thin as possible. However, because it is required to be with least approximately 100 μm so that the laser diode may be divided into chips at an improved yield, the facet thickness 10 is approximately 100 μm.

In the second prior art selective PHS structure laser diode, since the laser diode is mounted in the junction-up mounting, also in fabricating an array laser having a plurality of laser diodes in an array, it is easy to form the p-side electrodes the respective laser diodes. Therefore, advantageously, it is possible to drive respective laser diodes independently.

In the prior art semiconductor laser diodes with a PHS structure fabricated as described above, there are some problems as follows. In the first prior art semiconductor laser diode of PHS structure shown in FIG. 17, after forming the facets by wet etching, it is necessary to form the PHS electrode 106 of the cross-section trapezoidal shape covering the whole surfaces of the multi-layer epitaxial layers 101. Therefore, the laser diode is not produced at an improved yield because of the complicated process, even employing a highly accurate mask alignment technique. Further, because the laser diode is mounted in junction-down mounting, in fabricating the laser array, it is difficult to form the p-side electrode for each laser diode, and it is difficult to apply the prior art device to the array laser in which each laser diode is driven independently.

On the other hand, since the second prior art semiconductor laser diode with the selective PHS structure shown in FIG. 19 is mounted in junction-up mounting, in fabricating the array laser, it is easy to form the p-side electrode for each laser diode, and the structure is suitable for the array laser in which each laser diode is driven independently. Since the PHS electrode 8 is selectively buried in the n-type GaAs substrate 1, however, it is impossible for the PHS electrode cover the entire surface of the active region, and particularly the heat radiating characteristic at the light emitting facet is not improved. In other words, if the facet thickness 10 is 10 μm, the PHS electrode 8 functions to make the heat generated in the vicinity of the light emitting facet efficiently diffuse. However, it is extremely difficult to form the light emitting facet by cleavage with the remaining facet thickness of 10 μm, and the facet thickness 10 is practically approximately 100 μm. As a result, the heat radiating characteristic due to the PHS electrode 8 is extremely deteriorated at the light emitting facet, and it is difficult to make an laser array having a high power output and a long lifetime.

SUMMARY OF THE INVENTION

It is an object of the present invention to provide a semiconductor laser diode of selective PHS structure having an improved heat radiating characteristic at a laser beam emitting facet and having a high power output and a long lifetime, being suitable for a structure of an array laser.

It is another object of the present invention to provide a method for producing a semiconductor laser diode with a selective PHS structure.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to a first aspect of the present invention, a semiconductor laser diode with a selective PHS structure includes a semiconductor substrate having opposite first and second main surfaces, an active region of laser diode structure disposed on the first main surface, and a PHS electrode selectively buried in the second main surface. The active region of laser diode structure is located in an area defined by first parallel lines running in the direction perpendicular to the resonator length direction and second parallel lines located at the side surfaces of the semiconductor substrate. The first lines are located internally in the resonator length direction relative to the front and rear facets of the semiconductor substrate, respectively, and the PHS electrode has a length in the resonator length direction equal to or larger than that of the active region in the resonator length direction. Therefore, the heat radiating characteristic is improved especially at the laser beam emitting facets.

According to a second aspect of the present invention, in the semiconductor laser diode, a portion of the semiconductor substrate outside a laser beam emitting facet is processed in a shape tapered at a predetermined angle or in a shape including a step portion so that the laser beam emitting and broadening from the laser facet does not strike the semiconductor substrate. Therefore, the heat radiating characteristic is improved at the laser beam emitting facet, and it is possible to prevent the laser beam emitted from the light emitting facet from being reflected at some portion of the semiconductor substrate extending from the light emitting facet, producing a laser beam having a normal spot.

According to a third aspect of the present invention, a method for producing a semiconductor laser diode includes forming semiconductor active layers of a laser diode structure producing an active region on a first main surface of a semiconductor substrate, depositing a photoresist on the active layers and forming openings having edges perpendicular to the resonator length direction of the semiconductor laser diode in the photoresist, wet-etching the semiconductor active layers and the semiconductor substrate using the patterned photoresist as a mask, and processing a portion of the semiconductor substrate and the semiconductor active layers of the active region in tapered configurations in which portions of the active region are exposed in the openings, in such a manner that a tapered surface gets gradually deeper from its periphery toward its center in the resonator length direction, processing only a portion to become a light emitting facet of the laser diode in the tapered configuration regions by dry etching to be perpendicular to the first main surface of the semiconductor substrate, and selectively forming the PHS electrode on the second main surface of the semiconductor substrate, in which the length of the PHS electrode in the resonator length direction is almost equal to or larger than the length of the active region in the resonator length direction. Therefore, the selective PHS structure semiconductor laser diode having an improved heat radiating characteristic and a normal light spot, is produced with an improved yield.

According to a fourth aspect of the present invention, a method for producing a semiconductor laser diode includes forming semiconductor active layers of a laser diode structure producing an active region on a first main surface of a semiconductor substrate, depositing an insulating film on the active layers and forming openings having edges perpendicular to the resonator length direction of the semiconductor laser diode in the insulating film, gas-etching the semiconductor active layers and the semiconductor substrate using the patterned insulating film as a mask, and forming perpendicular surfaces to be emitting facets of the laser diode and tapered surfaces continuous with the lower ends of the perpendicular surfaces in one step, in which the tapered surfaces are tapered such that they become gradually deeper from the lower end toward the center in the resonator length direction, and selectively forming the PHS electrode on the second main surface of the semiconductor substrate, in which the length of the PHS electrode in the resonator length direction is almost equal to or larger than the length of the active region in the resonator length direction. Therefore, the selective PHS structure semiconductor laser diode having an improved heat radiating characteristic and a normal light spot is produced with an improved yield.

According to a fifth aspect of the present invention, a method for producing a semiconductor laser diode includes forming semiconductor active layers of a laser diode structure producing an active region on a first main surface of a semiconductor substrate, depositing an insulating film on the active layers and forming openings having edges perpendicular to the resonator length direction of the semiconductor laser diode in the insulating film, gas-etching the semiconductor active layers and the semiconductor substrate using the patterned insulating film as a mask, and forming perpendicular surfaces to be emitting facets of the laser diode and tapered surfaces continuous with the lower ends of the perpendicular surfaces in one step, in which the tapered surfaces are tapered such that they get gradually deeper from the lower end toward the center in the resonator length direction, forming a semiconductor thin film having an energy band gap larger than the energy to corresponding to the wavelength of the laser on the emitting facet of the laser diode, and selectively forming the PHS electrode on the second main surface of the semiconductor substrate, in which the length of the PHS electrode in the resonator length direction is almost equal to or larger than the length of the active region in the resonator length direction. Therefore, the selective PHS structure semiconductor laser diode with window portions having an improved heat radiating characteristic and a normal light spot, is produced with an improved yield.

According to a sixth aspect of the present invention, a method for producing a semiconductor laser diode includes forming the active region a laser diode structure on a first main surface of a semiconductor substrate, depositing an insulating film on the active region and forming openings having edges perpendicular to the resonator length direction of the semiconductor laser diode in the insulating film, forming perpendicular surfaces to be emitting facets of the laser diode and tapered surfaces continuous with the lower ends of the perpendicular surfaces in one step, which tapered surfaces are tapered such that they get gradually deeper from the lower end toward the center in the resonator length direction, by gas-etching the semiconductor active layers and the semiconductor substrate utilizing the patterned insulating film as a mask and supplying HCl Gas, AsH$_3$ gas and H$_2$ gas at the same time. Therefore, the light emitting facet and a tapered portion are produced in one step with good controllability.

According to a seventh aspect of the present invention, a method for producing a semiconductor laser diode includes forming semiconductor active layers of a laser diode structure including producing an active region on a first main surface of a semiconductor substrate, depositing a photoresist on the active layers and forming openings having edges perpendicular to the resonator length direction of the semiconductor laser diode in the photoresist, dry-etching the semiconductor active layers and the semiconductor substrate using the patterned photoresist as a mask, and forming hollowed portions which have side surfaces forming resonator facets perpendicular to the first main surface of the semiconductor substrate in the active region, and a predetermined depth so that a space produced outside the laser emitting facet includes the broadening angle of the emitted light beam in the thickness direction of the semiconductor substrate, and selectively forming the PHS electrode on the second main surface of the semiconductor substrate, in which the length of the PHS electrode in the resonator length direction is almost equal to or larger than the length of the active region in the resonator length direction. Therefore, a selective PHS structure semiconductor laser diode having an improved heat radiating characteristic and a normal light spot is produced with an improved yield.

According to an eighth aspect of the present invention, a semiconductor laser diode array has a selective PHS structure including a semiconductor substrate having opposite first and second surfaces, a plurality of active regions having a laser diode structure on the first surface, and a PHS electrode selectively buried in the second surface, in which the active region of laser diode structure located in an area is defined by first parallel lines running in a direction perpendicular to the resonator length direction and second parallel lines located at positions of the side surfaces of the semiconductor substrate, the first lines being located internally in the resonator length direction relative to the front and rear facets of the semiconductor substrate, respectively, and the PHS electrode has a length in the resonator length direction, equal to or larger than the length of the active region in the resonator length direction. Therefore, the heat radiating characteristic is improved at a laser beam emitting facet, achieving a monolithic laser diode array having high power output and long lifetime.

BRIEF DESCRIPTION OF THE DRAWINGS

FIGS. 5(a) to 5(e) are cross sectional views illustrating process steps of a method for producing a semiconductor laser diode in accordance with a fifth embodiment of the present invention.

FIGS. 8(a) to 8(d) are cross sectional views illustrating process steps of a method for producing a semiconductor laser diode in accordance with a seventh embodiment of the present invention.

FIGS. 9(a) to 9(d) are cross sectional views illustrating process steps of a method for producing a semiconductor laser diode in accordance with an eighth embodiment of the present invention.

DETAILED DESCRIPTION OF THE PREFERRED EMBODIMENT

First Embodiment

Figure 1:
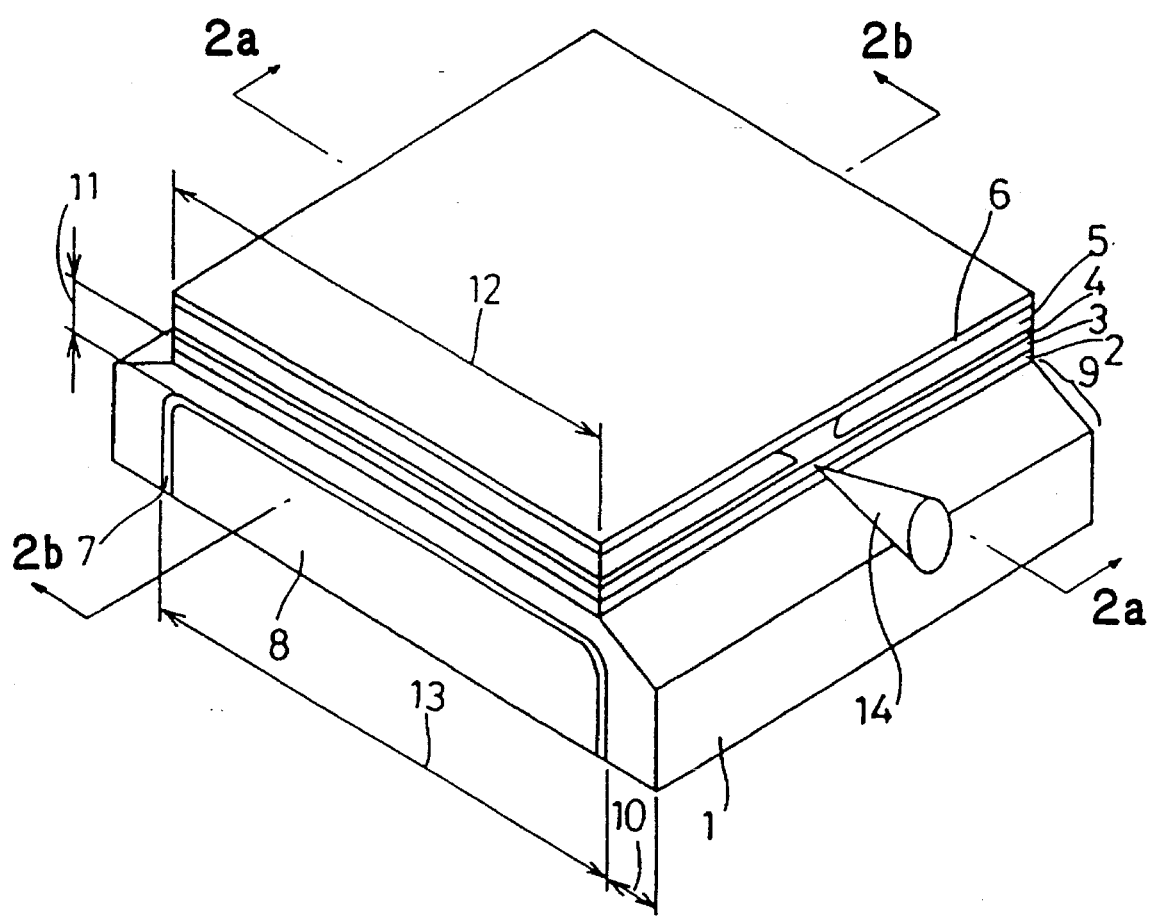
FIG. 1 is a perspective view schematically illustrating a semiconductor laser diode in accordance with a first embodiment of the present invention.

FIG. 1 is a perspective view schematically illustrating a semiconductor laser diode in accordance with a first embodiment of the present invention. In the figure, an n-type $Al_xGa_{1-x}As$ first cladding layer 2 is disposed on an n-type GaAs substrate 1, a p-type $Al_yGa_{1-y}As$ active layer 3 is disposed on the first cladding layer 2, and a p-type $Al_xGa_{1-x}As$ second cladding layer 4 is disposed on the active layer 3. A portion of the second cladding layer 4 is formed in a stripe shape ridge by etching. An n-type GaAs current blocking layer 5 is disposed on both sides of the striped ridge of the second cladding layer 4 to burying the stripe ridge, and a p-type GaAs contact layer 6 is disposed on the current blocking layer 5 and the stripe ridge. A concave part is produced on the rear surface of the substrate 1, and an n-side ohmic electrode 7 covers the internal wall of the concave part. The concave part on the rear surface of the substrate 1 is filled with a PHS electrode 8. Further, reference numeral 9 designates a shoulder part of the n-type GaAs substrate 1 (hereinafter referred to as substrate shoulder part), numeral 10 designates a thickness from the substrate facet to the side of the PHS electrode 8 (hereinafter referred to as facet thickness), numeral 11 designates a thickness from the active layer 3 to the upper surface of the PHS electrode 8 (hereinafter referred to as remaining substrate thickness), numeral 12 designates the length of the active region in the resonator length direction (hereinafter referred to as resonator length), numeral 13 designates the length of the PHS electrode in the resonator length direction (hereinafter referred to as PHS electrode length), and numeral 14 designates an emitted laser beam. A p-side electrode is disposed on the p-type GaAs contact layer 6.

Figure 2A:
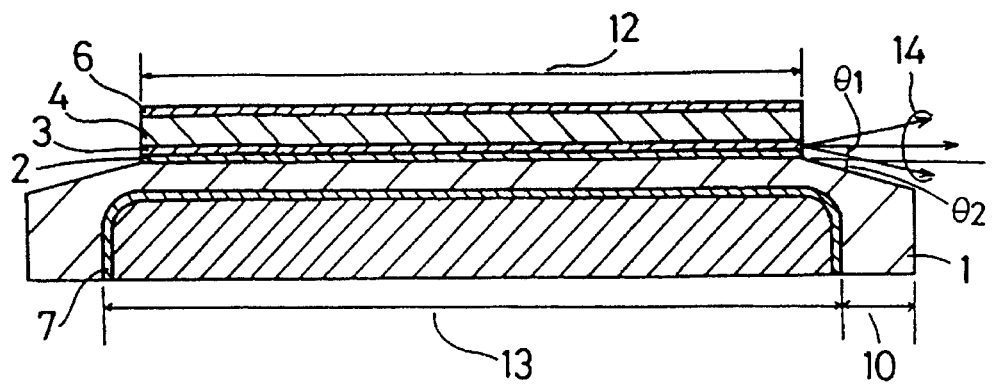
FIGS. 2(a) to 2(d) are cross sectional views schematically illustrating a semiconductor laser diode in accordance with the first to third embodiments of the present invention.
Figure 2B:
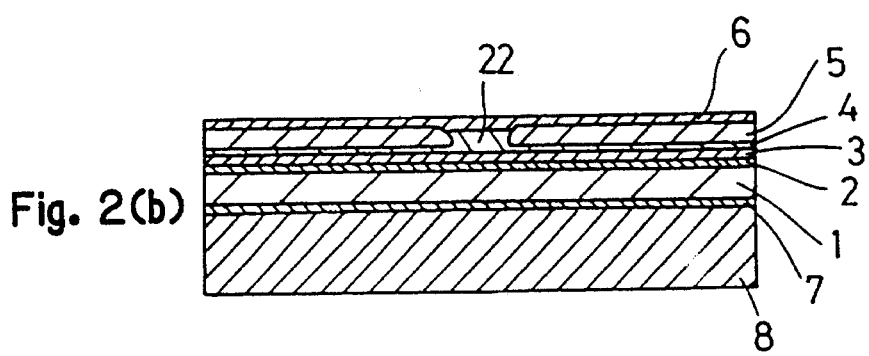

FIGS. 2(a) and 2(b) are cross sectional views schematically illustrating the semiconductor laser diode with a selective PHS structure of this first embodiment of the present invention in a greater detail. FIG. 2(a) is a cross section taken along a line 2a—2a of FIG. 1, which is parallel to the resonator length direction, and FIG. 2(b) is a cross section taken along a line 2a–2b of FIG. 1, which is perpendicular to the resonator length direction.

In this first embodiment, the laser active region comprising the first cladding layer 2, the active layer 3, the second cladding layer 4, the current blocking layer 5 and the contact layer 6, is located in an area defined by a first pair of parallel lines running in the direction perpendicular to the resonator length direction and a second pair of parallel lines located at positions of the side surfaces of the semiconductor substrate. The first pair of lines are located internally in the resonator length direction relative to the front and rear facets of the semiconductor substrate, respectively. The PHS electrode length satisfies a relation of $A \leq B$, supposing that the resonator length 12 is A and the PHS electrode length 13 is B. Further, as shown in FIG. 2(b), the PHS electrode 8 has a width corresponding to the entire width of the active region in the direction perpendicular to the resonator length direction.

The substrate shoulder part 9 caused by the difference between the resonator length and the length of the substrate 1 in the resonator length direction is tapered having an appropriate angle $\Theta 2$ so that the laser beam 14 emitted from the resonator facet with a specific beam broadening angle does not strike on this shoulder part 9. In this embodiment, the shoulder part 9 is tapered at an angle ($\theta 2$) of 25°. Since the whole beam broadening angle in the thickness direction of the active layer of the emitted laser beam of the high power laser employed for an optical-magnetic disc, which has an oscillation wavelength of about 780 nm, is usually 25° to 30°, the broadening angle $\theta 1$ in the substrate direction is 12.5° to 15°, which is almost half of the beam broadening angle in the thickness direction of the active layer. Therefore, if the shoulder part is tapered at an angle of 25°, reflection of the laser beam at the substrate shoulder part is prevented. Here, the thicknesses and the material compositions of the respective layers of the active region of the typical 780 nm band short wavelength laser employed for the optical-magnetic disc are as follows: the first cladding layer 2 comprises an n-type $Al_{0.5}Ga_{0.5}As$ layer having a thickness of 1.5 µm, the active layer 3 comprises a p-type $Al_{0.15}Ga_{0.85}As$ layer having a thickness of 400 Å, the second cladding layer 4 comprises a p-type $Al_{0.5}Ga_{0.5}As$ layer having a thickness of 1.5 µm (the thickness except the ridge part is 0.3 µm), the current blocking layer 5 comprises an n-type GaAs layer having a thickness of 1.2 µm, the contact layer 6 including the cap layer comprises a p-type GaAs layer having a thickness of 3.0 µm, and the whole beam broadening angle in the thickness direction is 25°.

In this embodiment, by adopting the structure as described above, the selective PHS electrode 8 covering the entire active region is formed in the resonator length direction. Further, since the facet thickness 10 is about 100 µm, the device is easily separated by cleaving or dicing, and its mechanical strength as a structure supporting member is also sufficiently maintained. Here, the remaining substrate thickness 11 is 15 µm.

Figure 3:
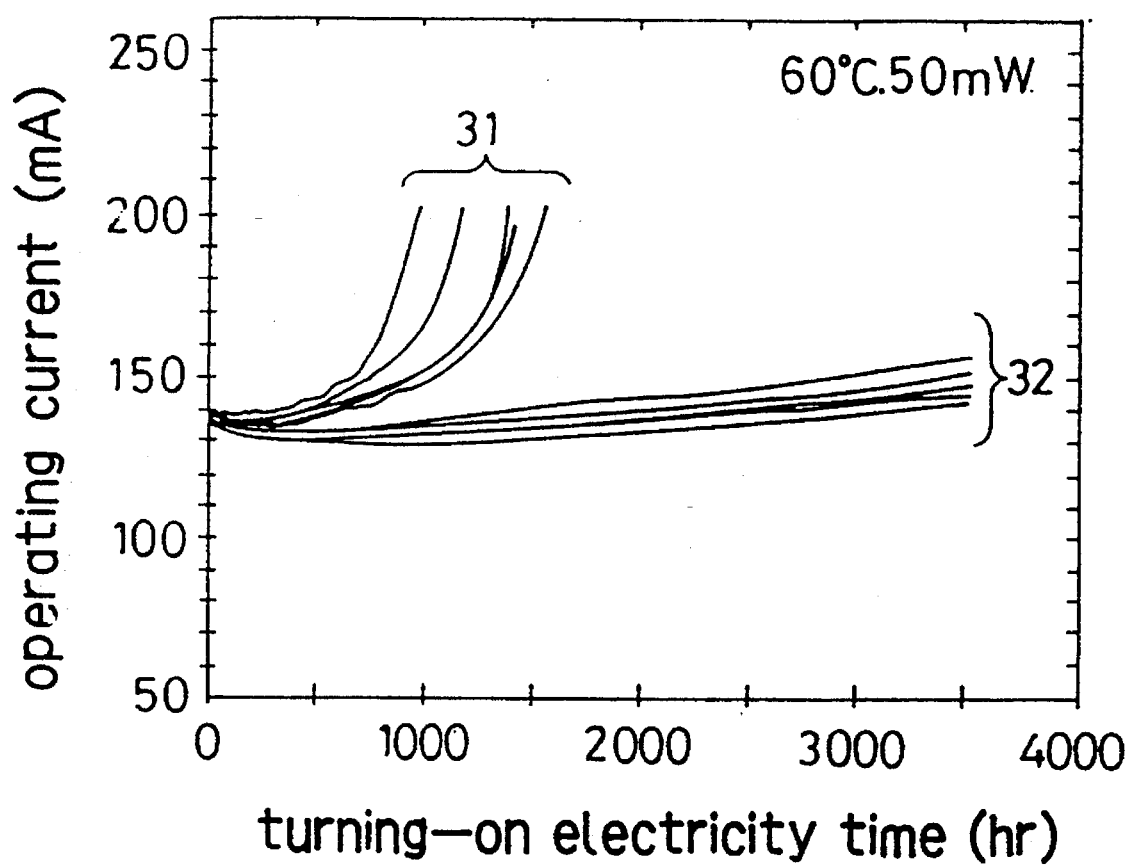
FIG. 3 is a graph showing a result of a semiconductor laser diode in accordance with the first embodiment of the present invention.
Figure 19:
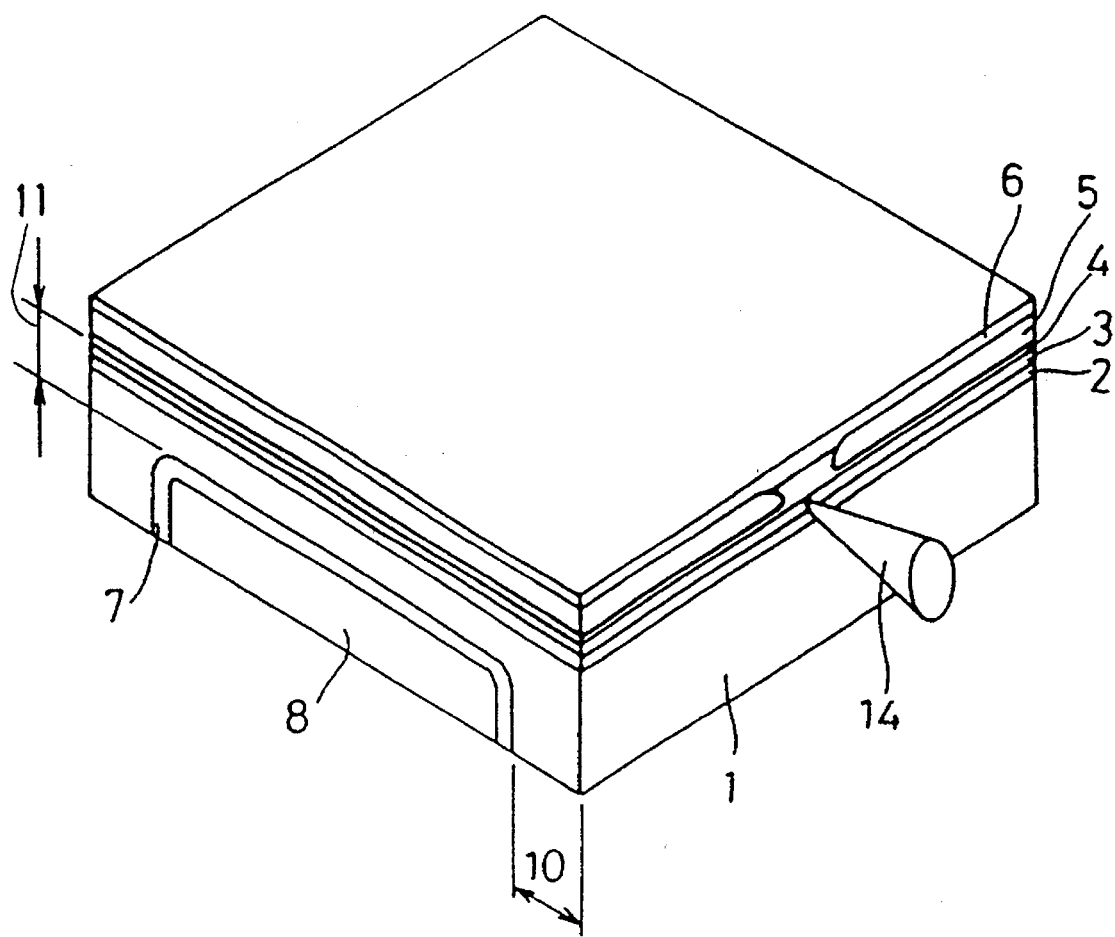
FIG. 19 is a perspective view for explaining the prior art selective PHS structure semiconductor laser diode.

FIG. 3 is a graph showing results of a long-term electrical test when the selective PHS structure semiconductor laser diode of FIG. 1 and the prior art semiconductor laser diode of selective PHS structure of FIG. 19 are operated at 60° C. and 50 mW. In the figure, reference numeral 31 designates the test result of the prior art semiconductor laser diode with the selective PHS structure shown in FIG. 19, and numeral 32 designates the test result of the semiconductor laser diode with the selective PHS structure of FIG. 1.

As shown in the figure, in the selective PHS structure semiconductor laser diode in accordance with the first embodiment, while a little increase in operating current is presented accompanying with an increase in the turning-on time stable operation is obtained even after 3500 hours. In the prior art selective PHS structure semiconductor laser diode, a sudden deterioration is presented within 1500 hours. When the deterioration modes thereof are investigated, almost all of them are due to the facet deterioration mode, and the graph shows that sufficient heat radiating effects are not present in regions in the vicinity of the light emitting facets in the prior art laser diode of FIG. 19. On the other hand, in the selective PHS structure semiconductor laser diode of this first embodiment, the failures due to the facet deterioration mode do not occur even after 3500 hours. This means that the heat radiating characteristic is improved and the lifetime of the laser diode is improved by forming the selective PHS electrode 8 covering the entire surface of the active region in the resonator length direction.

Second Embodiment

Figure 2C:
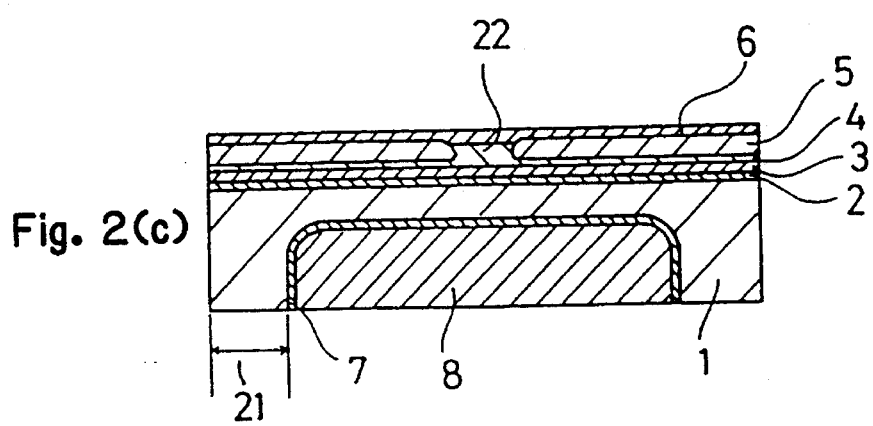

While the PHS electrode 8 covers the entire active region in the direction perpendicular to the resonator length direction in the above-described first embodiment, as shown in FIG. 2(c), the PHS electrode 8 is not always required to cover the entire active region in the plane perpendicular to the resonator length direction as in a second embodiment of the present invention. This is the reason why in the ridge laser diode the heat generation is the largest in the vicinity of the light emitting region of the laser beam, i.e., in the vicinity of a ridge 22 and on both sides of the ridge, little heat is generated. Therefore, the PHS electrode 8 is formed in a region sufficiently covering the ridge 22.

In this second embodiment, a thickness 21 from the side surface of the substrate to the PHS electrode is about 100 μm, and it has sufficient mechanical strength to be a structure supporting member of the n-type GaAs substrate 1.

Third Embodiment

Figure 2D:
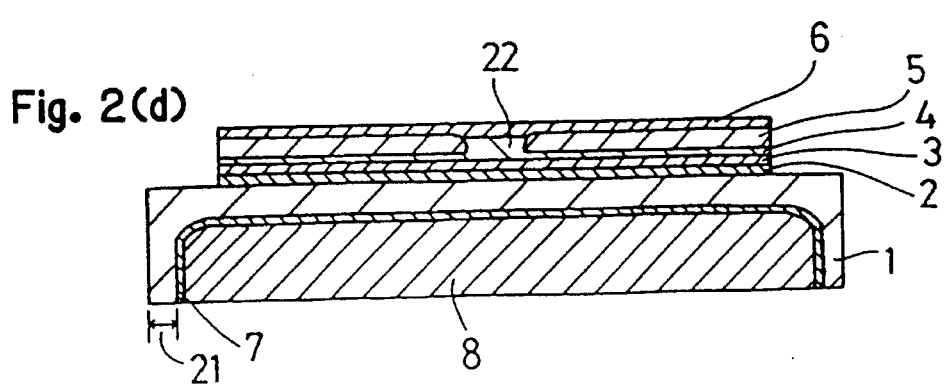

In the first embodiment shown in FIG. 2(b), the PHS electrode 8 covers the whole substrate in the laser diode where the width of the substrate 1 is equal to that of the active region. In a third embodiment of the present invention as shown in FIG. 2(d), the PHS electrode 8 has a width smaller than that of the substrate and the width of the active region is equal to or smaller than the width of the PHS electrode 8, producing a structure in which the PHS electrode 8 covers the entire active region.

Fourth Embodiment

Figure 4:
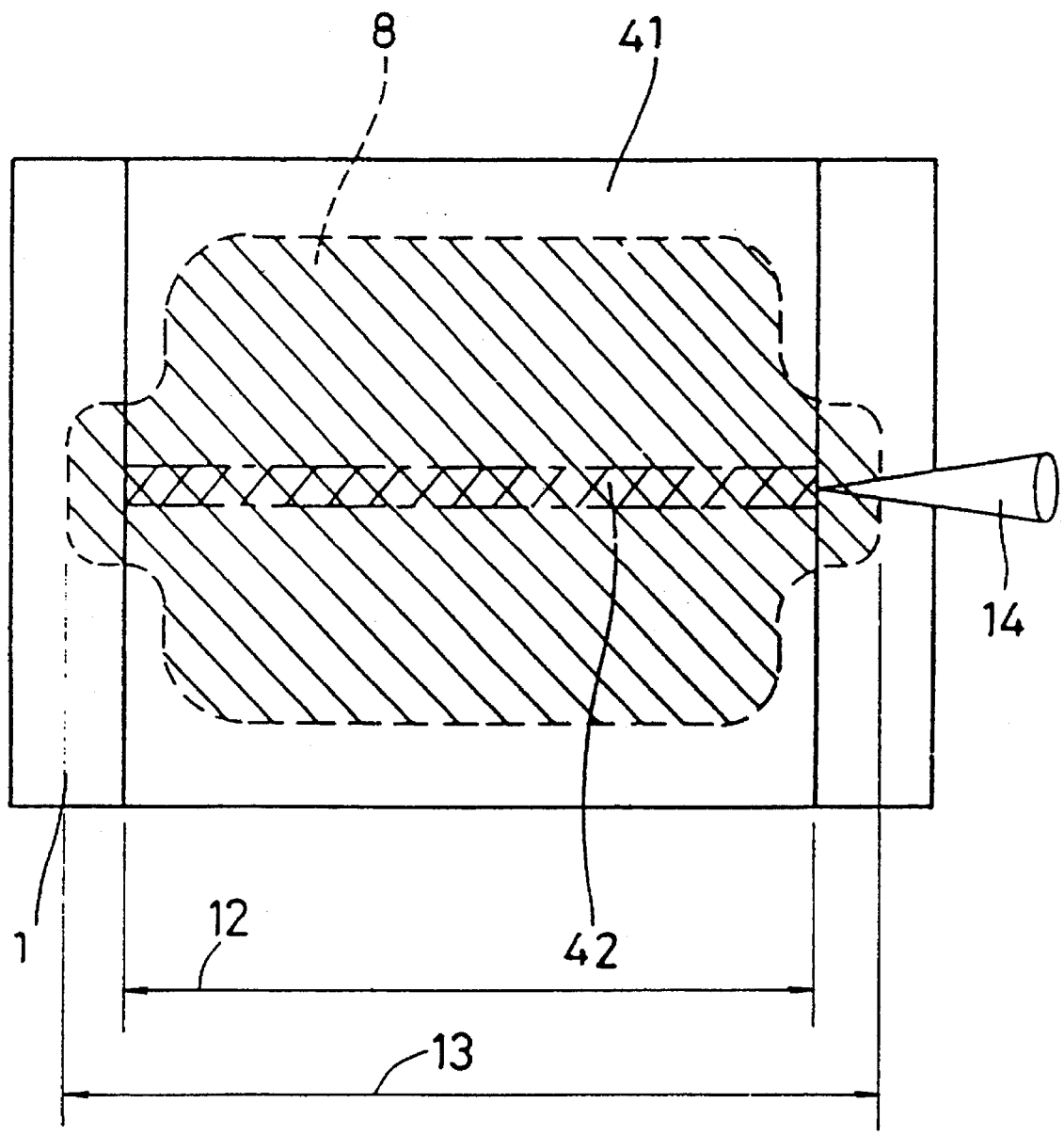
FIG. 4 is a top plan view for explaining a PHS electrode of a semiconductor laser diode in accordance with a fourth embodiment of the present invention.

FIG. 4 is a top plan view illustrating a PHS electrode of a semiconductor laser diode with a selective PHS structure in accordance with a fourth embodiment of the present invention. In the figure, reference numeral 1 designates an n-type GaAs substrate, numeral 8 designates a PHS electrode, numeral 12 designates the resonator length, numeral 13 designates the PHS electrode length, numeral 14 designates a laser beam, numeral 41 designates an active region, and numeral 42 designates a ridge forming part to be a region where a current passes in the active region. In this fourth embodiment, supposing that the resonator length 12 and the PHS electrode length 13 in the resonator length direction are A and B, respectively, the region satisfying the relation of $A \leq B$ is present only in the vicinity of the ridge 42. The purpose of this structure is to improve the heat radiating characteristic only in the vicinity of the ridge 42 where the heat generation is the largest, improving the heat radiating characteristic as well as easily maintaining the mechanical strength of the n-type GaAs substrate 1 as a structure supporting member.

Fifth Embodiment

FIGS. 5(a)–5(e) and 6(a)–6(b) are cross sections illustrating process steps of a method for producing a selective PHS structure semiconductor laser diode in accordance with a fifth embodiment. The production method of the selective PHS structure semiconductor laser diode in accordance with this fifth embodiment is employed for producing the selective PHS structure semiconductor laser diode of the above-described first to fourth embodiments. In the figures, the same reference numerals as those of FIG. 1 designate the same or corresponding parts. Reference numeral 61 designates a photoresist and numeral 62 designates a laser beam emitting facet (resonator facet).

Next description will be given of the process steps with reference to these drawings.

First, as shown in FIG. 5(a), active region 41 of laser diode structure is formed on the n-type GaAs substrate 1 and photoresist 61 is deposited thereon, and then the photoresist 61 is patterned in the size of the laser resonator. In this fifth embodiment, the resonator length is 350 μm and the length of the opening of the photoresist in the resonator length direction is 250 μm.

Secondly, as shown in FIG. 5(b), the semiconductor layers are etched into a tapered shape (hereinafter referred to as taper etching) employing the photoresist 61 as an etching mask. In this embodiment, a mixture of tartaric acid, hydrogen peroxide water, and water is employed as an etchant. For example, when etching is carried out with the etchant mixed in the ratio of tartaric acid ($C_4H_6O_6$) : hydrogen peroxide ($H_2O_2$) : water ($H_2O$)=10:1:20, the semiconductor layers are etched in a tapered shape at an angle of about 25°.

Thirdly, employing reactive ion etching (RIE) technique, as shown in FIG. 5(c), anisotropic etching is carried out in the direction perpendicular to the substrate 1 using the photoresist 61 as an etching mask. Generally, it is necessary to form the light emitting facet of the laser diode at an angle almost perpendicular to the resonator length direction. For this purpose, the facet is conventionally formed by cleaving, but recently, with rapid improvement in dry etching techniques, it is possible to form the laser beam emitting facet by dry etching. In this embodiment, the laser beam emitting facet 62 is formed by dry etching, i.e., RIE.

Next, as shown in FIG. 5(d), the substrate 1 of thickness t is polished to a thickness of about 100 μm, an etching mask of a prescribed pattern is formed at the rear surface side of the substrate 1, and holes having a size corresponding to the PHS electrode are produced by RIE. In accordance with the configuration of this etching mask, the PHS electrodes of various configurations as described in the first to the fourth embodiments, are produced.

At the rear surface of the substrate 1 where the holes 63 are formed as described above, as illustrated in FIG. 5(e), an n-side ohmic electrode forming layer 64 and a PHS electrode forming layer 65 are successively produced. In this fifth embodiment, the n-side ohmic electrode forming layer 64 is produced by vacuum evaporation, and the PHS electrode forming layer 65 is produced by gold plating using the ohmic electrode forming layer 64 as a feeding layer.

Figure 6A:
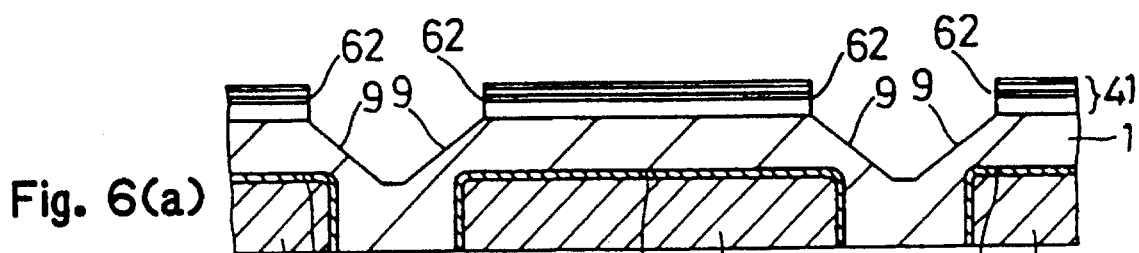
FIGS. 6(a) and 6(b) are cross sectional views illustrating process steps of the method for producing a semiconductor laser diode in accordance with the fifth embodiment of the present invention.

Then, as shown in FIG. 6(a), the PHS electrode forming layer 65 and the n-side ohmic electrode forming layer 64 are partially removed by grinding with the remaining portions thereof only inside the hole 63, forming the n-side ohmic electrode 7 and the PHS electrode 8.

Figure 6B:
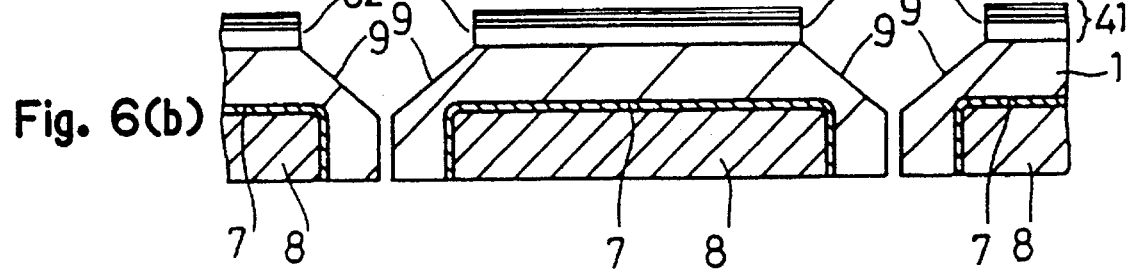

Finally, as shown in FIG. 6(b), the respective laser diodes are separated from each other by dicing or cleaving, producing the selective PHS structure semiconductor laser diode described in the above-described first to fourth embodiments.

Thus, according to the method for producing a semiconductor laser diode in accordance with this fifth embodiment, by combining the taper etching employing a wet etching step and anisotropic etching by RIE, the tapered substrate shoulder part and the laser beam emitting facet are produced, and then the PHS electrode 8 is selectively buried in the rear surface side of the n-type GaAs substrate 1. Therefore, the selective PHS structure semiconductor laser diode in accordance with the first to the fourth embodiments is produced at an improved yield.

While in the fifth embodiment RIE is employed for producing the laser beam emitting facet, other dry etching techniques such as electron cyclotron resonance (ECR) etching may be employed. Or when a focused ion beam method is employed, the same advantages are obtained.

While in this embodiment no description given of a method for forming the p-side electrode, before forming the resist pattern 62, the p-side electrode may be produced on the active region 41 and etching is carried out including the p-side electrode. Further, it is possible to form this p-side electrode by deposition or the like in a state where the etched region is covered with a photoresist after the dry etching illustrated in FIG. 5(c) is performed.

Sixth Embodiment

Figure 7A:
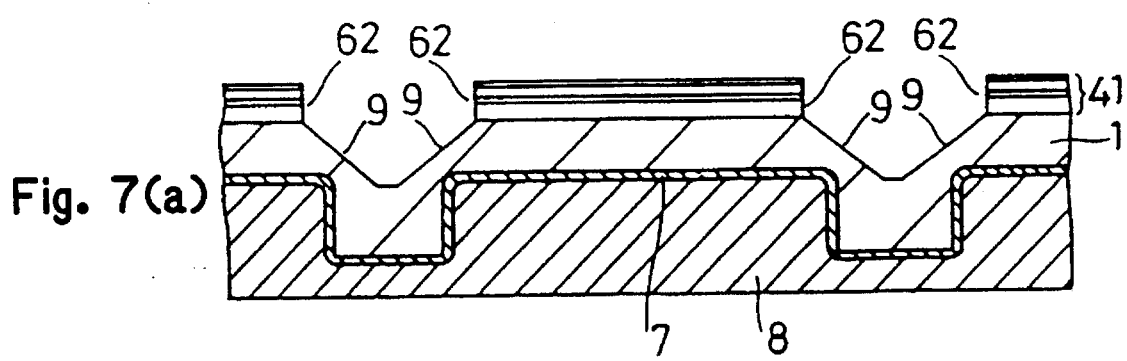
FIGS. 7(a) and 7(b) are cross sectional views illustrating process steps of a method for producing a semiconductor laser diode in accordance with a sixth embodiment of the present invention.
Figure 7B:
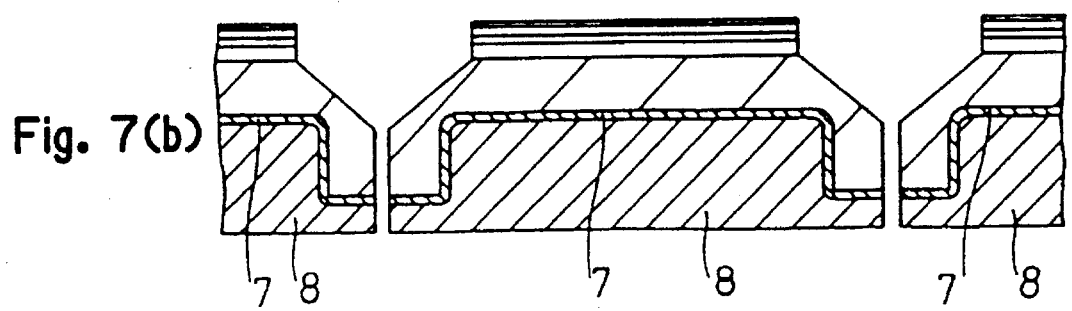

While in the fifth embodiment the PHS electrode forming layer 65 and the n-side ohmic electrode forming layer 64 disposed on the rear surface of the substrate 1 are partially removed, with the remaining portions thereof only inside the hole 63, as shown in FIGS. 7(a) and 7(b), in accordance with a sixth embodiment of the present invention, only the PHS electrode forming layer 65 may be remove off so that portions thereof also remain outside the hole on the rear surface of the substrate 1. In this sixth embodiment, the time required for material removed is shortened. Here, in the process of chip separation illustrated in FIG. 7(b), since the n-side ohmic electrode 7 and the PHS electrode 8 exist in separating parts, but dicing is employed.

Seventh Embodiment

FIGS. 8(a) to 8(d) are cross sectional views illustrating process steps of a method for producing a selective PHS structure semiconductor laser diode in accordance with a seventh embodiment of the present invention. The production method of the selective PHS structure semiconductor laser diode in accordance with this seventh embodiment is employed for producing the selective PHS structure semiconductor laser diode of the above-described first to fourth embodiments. In the figures, reference numeral 1 designates an n-type GaAs substrate, numeral 7 designates an n-side ohmic electrode, numeral 8 designates a PHS electrode, numeral 9 designates a shoulder part of the n-type GaAs substrate 1, numeral 41 designates an active region, numeral 62 designates a laser beam emitting facet and numeral 66 designates a SiN film.

Next description will be given of the process steps with reference to these drawings.

First, as shown in FIG. 8(a), after the active region 41 of the laser diode structure is formed on the n-type GaAs substrate 1 and the SiN film 66 is deposited thereon, the SiN film 66 is patterned to the length of the laser resonator by conventional photolithography. In this seventh embodiment, the resonator length is 350 μm and the length of the opening of the photoresist in the resonator length direction is 250 μm.

Figure 10:
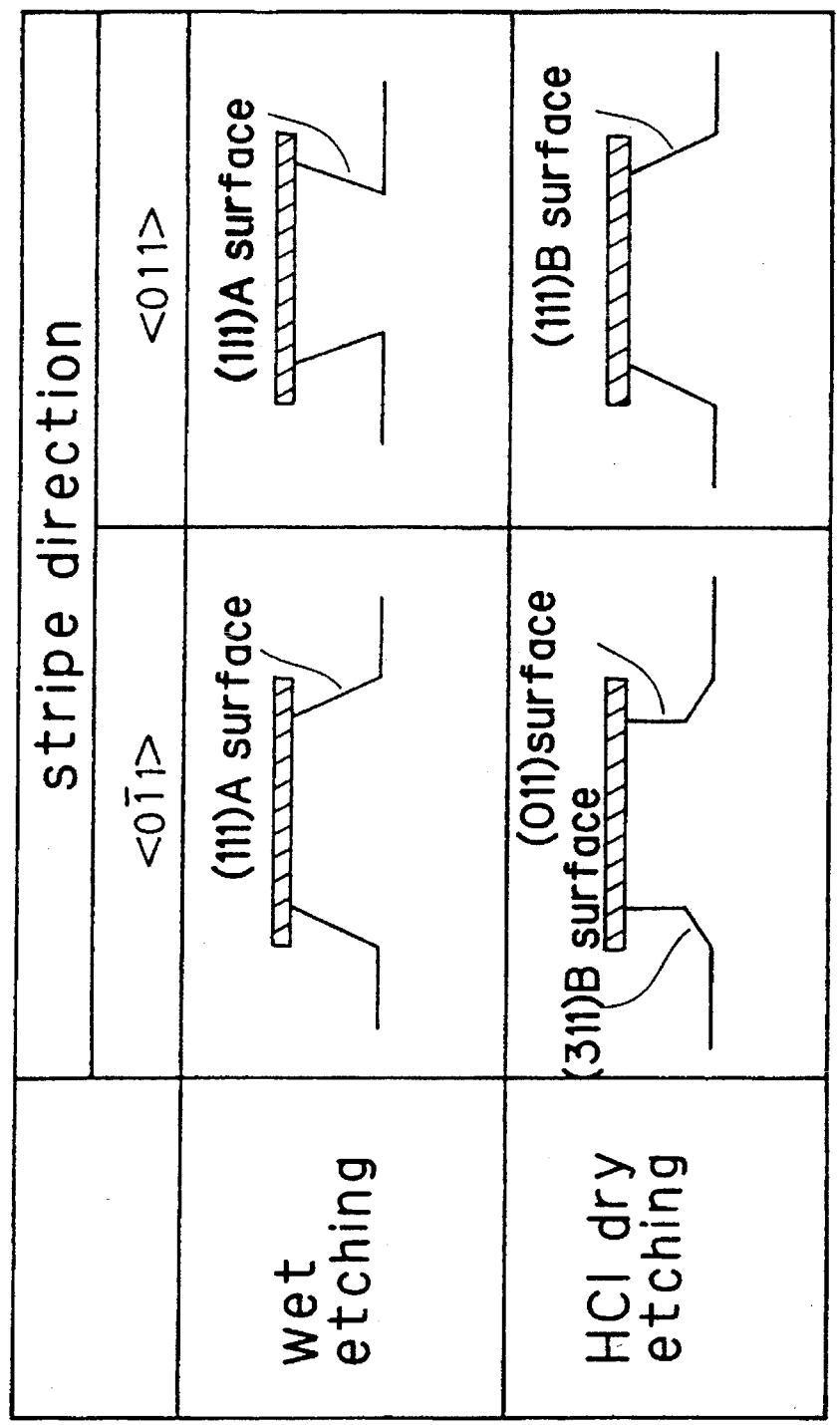
FIG. 10 is a diagram for explaining an etching configuration in the seventh and the eighth embodiments of the present invention.

Secondly, as shown in FIG. 8(b), the laser beam emitting facet 62 and the substrate shoulder part 9 of the n-type GaAs substrate 1 are formed in one step by HCl gas etching employing the SiN film 66 as an etching mask. As disclosed in Japanese Patent Application No.4-269610 by the inventor of the present invention, when gas etching is conducted by supplying HCl gas, $AsH_3$ and $H_2$ at the same time, configurations shown in FIG. 10 appear in the side surfaces of the formed mesa. More particularly, by patterning the insulating film in a specific direction, etching that produces the emitting facet having a (011) surface and the substrate shoulder part on a (311)B surface is easily carried out. Here, since the detailed etching conditions are the same as those described in Japanese Patent Application No.4-269610, a description is omitted. Thus, by using the HCl gas etching technique, the configuration illustrated in FIG. 8(b) is easily obtained.

Thirdly, a hole having a size corresponding to the PHS electrode is produced at the rear surface of the n-type GaAs substrate 1 by RIE. In accordance with the configuration of the etching mask employed in this step, PHS electrodes of various configurations as described in the first to the fourth embodiments, are produced. Then, as illustrated in FIG. 8(c), the n-side ohmic electrode 7 and the PHS electrode 8 are successively produced. Similarly to the above-described fifth embodiment, after the n-side ohmic electrode forming layer is produced by vacuum evaporation, and the PHS electrode forming layer is produced by gold plating utilizing the ohmic electrode forming layer as a feeding layer, parts of the PHS electrode forming layer and the n-side ohmic electrode forming layer are removed, leaving portions thereof only inside the hole 63, thereby forming the n-side ohmic electrode 7 and the PHS electrode 8.

Finally, as shown in FIG. 8(d), the respective laser diodes are separated from each other by dicing or cleaving, producing the selective PHS structure semiconductor laser diode described in the above-described first to fourth embodiments.

Thus, according to the method for producing the semiconductor laser diode in accordance with this seventh embodiment, the laser beam emitting facet and the substrate shoulder part of tapered shape are produced by HCl Gas etching in one step, and then the PHS electrode 8 is selectively buried at the rear surface side of the n-type GaAs substrate 1. Therefore, the selective PHS structure semiconductor laser diode described in the above-described first to fourth embodiments is produced at an improved yield. While in the seventh embodiment SiN is employed as the insulating film, other insulating film such as $SiO_2$ film or SiON film may be employed.

Eighth Embodiment

FIGS. 9(a) to 9(d) are cross sectional views illustrating process steps of a method for producing the selective PHS structure semiconductor laser diode in accordance with an eighth embodiment of the present invention. In the figures, the same reference numerals as those of FIGS. 8(a) to 8(d) designate the same or corresponding parts. Reference numeral 67 designates an $Al_zGa_{1-z}As$ window layer.

First, as shown in FIG. 9(a), the active region 41 of laser diode structure is formed on the n-type GaAs substrate 1 and the SiN film 66 is deposited thereon, and then, the SiN film 66 is patterned in the size of the laser resonator by conventional photolithography. In this eighth embodiment, the resonator length is 350 μm and the length of the opening of the photoresist in the resonator length direction is 250 μm.

Secondly, as shown in FIG. 9(b), the laser beam emitting facet 62 and the substrate shoulder part 9 are formed in one step by HCl gas etching employed in the seventh embodiment using the SiN film 66 as an etching mask. The process steps up to this point are the same as shown in the above-described seventh embodiment.

Secondly, the $Al_zGa_{1-z}As$ (z=0.5) window layer 67 is grown by MOCVD. This $Al_zGa_{1-z}As$ window layer 67 is provided to suppress light absorption at the laser beam emitting facet 62 and prevent facet damage. Desired effects can be obtained by forming a semiconductor material having a energy band gap larger than the energy of the oscillation wavelength of the laser to a thickness of about 0.1 µm. For example, in a high power AlGaAs laser producing light at 780 nm, since the energy of the oscillation wavelength is approximately 1.59 eV and the energy band gap of $Al_zGa_{1-z}As$ (z=0.5) is approximately 2.06 eV, the facet damage is prevented by using a $Al_zGa_{1-z}As$ window layer 67.

Here, it is desirable that HCl gas etching and the growth of the $Al_zGa_{1-z}As$ window layer 67 by MOCVD are performed continuously in the same chamber, or that a system in which a wafer is automatically carried between an etching chamber and an MOCVD chamber in the hydrogen gas ambient be employed.

While in the above described eighth embodiment $Al_zGa_{1-z}As$ (z=0.5) is employed as a material for the window layer, the same effects are obtained when employing other materials having an energy band gap larger than the energy of oscillation wavelength of the laser light. Thus, the material is not limited to $Al_zGa_{1-z}As$ (z=0.5).

While in the above-described seventh and eighth embodiments HCl gas etching is employed for producing the emitting facet and the substrate shoulder part in one step, other chlorine system gases such as $Cl_2$ gas may be employed to carry out the same processing.

Ninth Embodiment

Figure 11A:
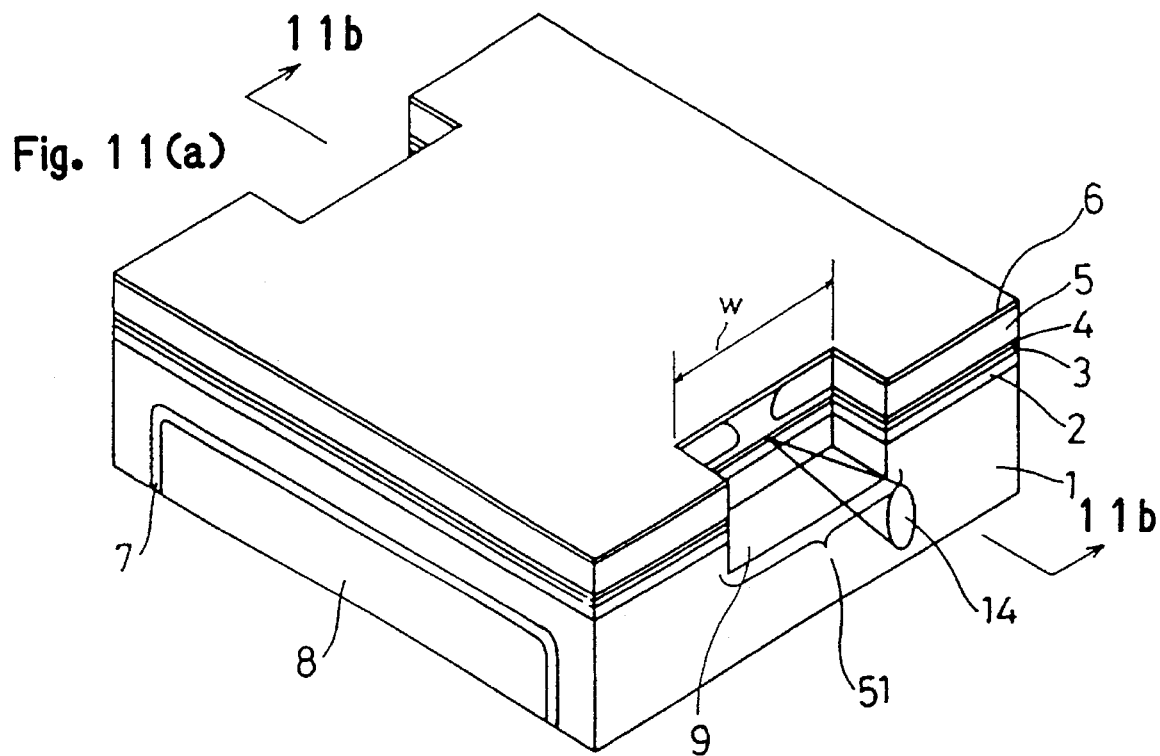
FIGS. 11(a) and 11(b) are, respectively, a perspective view and a cross sectional view of a semiconductor laser diode in accordance with a ninth embodiment of the present invention.
Figure 11B:
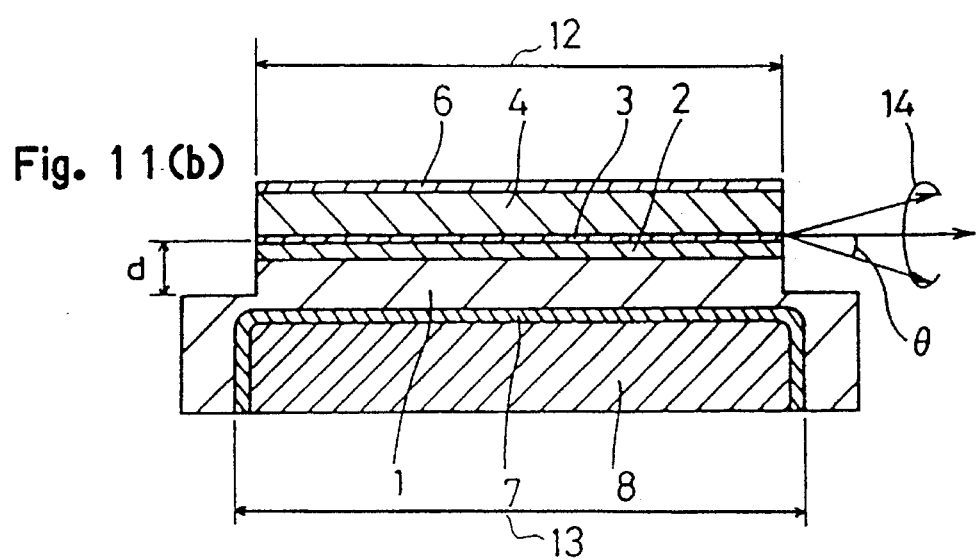

FIG. 11(a) is a perspective view illustrating a selective PHS structure semiconductor laser diode in accordance with a ninth embodiment of the present invention. FIG. 11(b) is a cross section taken along a line 11b—11b of FIG. 11(a). In the figures, the same reference numerals as those of FIG. 1 designate the same or corresponding parts. Reference numeral 51 designates a hollowed portion defined by walls including a wall of the laser resonator facet, opposite side walls and a bottom wall. The width w of the hollowed portion 51 is larger than the width of the laser beam 14 broadening in the direction of the laser device width so that the laser beam 14 emitted from the resonator facet with a specific beam broadening angle does not strike a side surface of the hollowed portion 51. The depth d of the hollowed portion 51 from the active layer 3 is deeper than the width of the laser beam 14 broadening in the thickness direction of the substrate so that the laser beam 14 emitted from the resonator facet with a specific beam broadening angle does not strike the substrate shoulder part 9.

In this ninth embodiment, as illustrated in FIG. 11(b), the PHS electrode length also satisfies the relation of A≦B, supposing that the resonator length 12 is A and the PHS electrode length 13 is B. Therefore, similarly to the first embodiment, the heat radiating characteristic is improved, and the lifetime of the laser diode is also improved.

Tenth Embodiment

Figure 12A:
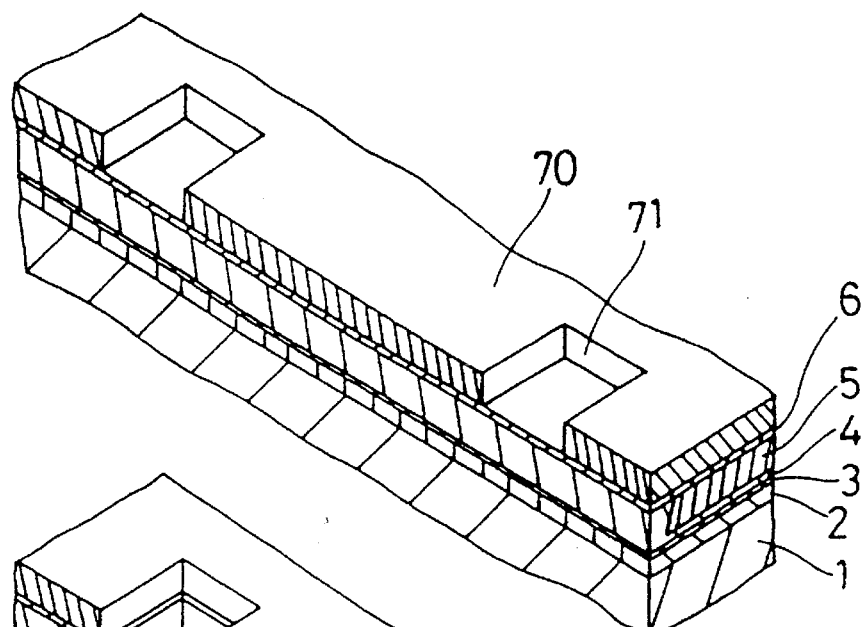
FIGS. 12(a) to 12(c) are diagrams illustrating process steps of a method for producing a semiconductor laser diode in accordance with a tenth embodiment of the present invention.
Figure 12B:
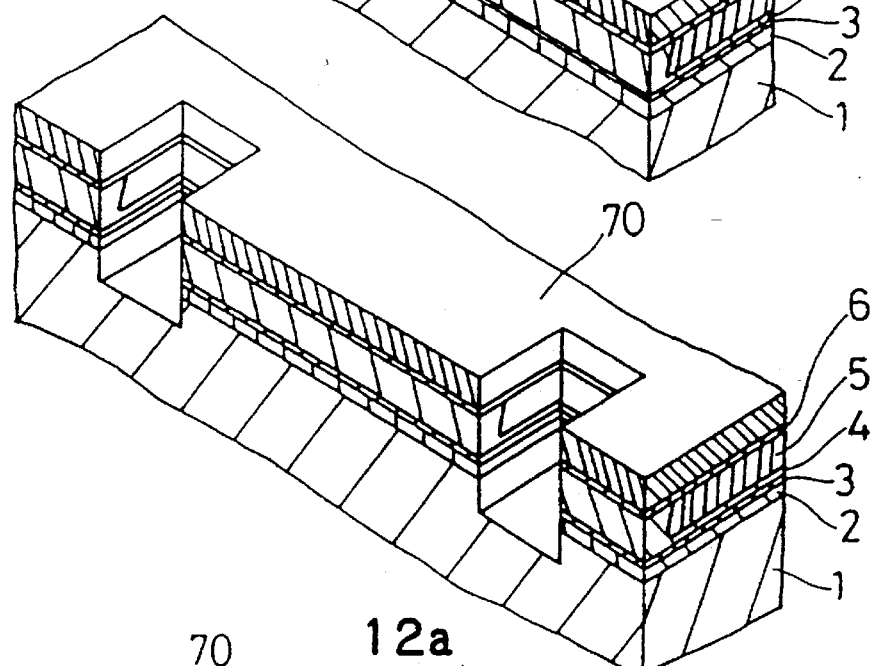

FIGS. 12(a) and 12(b) are perspective views illustrating process steps of a method for producing a semiconductor laser diode of selective PHS structure in accordance with a tenth embodiment of the present invention. The production method of the selective PHS structure semiconductor laser diode in accordance with this tenth embodiment is employed for producing the selective PHS structure semiconductor laser diode of the above-described ninth embodiment.

A description will be given with reference to these drawings of the process steps for producing the selective PHS structure semiconductor laser diode in accordance with the tenth embodiment.

Figure 12C:
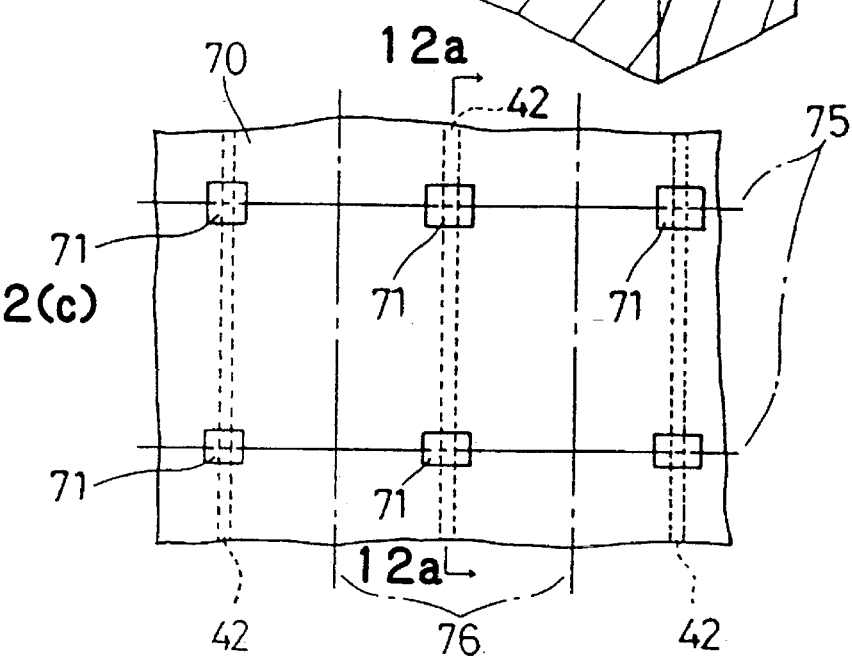

The process step for producing, on the substrate 1, the semiconductor active region comprising the first cladding layer 2, the active layer 3, the second cladding layer 4, the current blocking layer 5 and the contact layer 6 is exactly the same as the step of the fifth embodiment illustrated in FIG. 5(a). Then, as shown in FIG. 12(a), a resist pattern 70 having an opening 71 in a region where the resonator facet is to be formed, is formed on the contact layer 6. FIG. 12(c) is a top plan view of the wafer in this state. As shown in this figure, the openings 71 of the resist pattern correspond to the positions of the ridge stripe 42. In FIG. 12(c), reference numeral 75 designates a device dividing line in the resonator length direction, and numeral 76 designates a device dividing line in the device width direction.

Next, by anisotropic-etching the semiconductor active region and the semiconductor substrate, for example, by RIE, utilizing the resist pattern 70 as a mask, as shown in FIG. 12(b), the laser resonator facet perpendicular to the wafer surface is formed. Then, the n-side ohmic electrode 7 and the PHS electrode 8 are formed by the exactly same steps as those of the fifth embodiment illustrated in FIG. 5(d) and 5(e) and FIG. 6(a). Finally, by cleaving along the device dividing lines 75 and dicing along the device dividing lines 76 shown in FIG. 12(c), the completed semiconductor laser device illustrated in FIG. 11 is obtained.

In this tenth embodiment, the structures for preventing the laser beam from being reflected by the resonator facet and the substrate shoulder part, are produced by one time dry etching, easily producing the selective PHS structure semiconductor laser diode that has an improved heat radiating characteristic at the laser beam emitting facet and the laser beam of a normal spot.

Eleventh Embodiment

Figure 13:
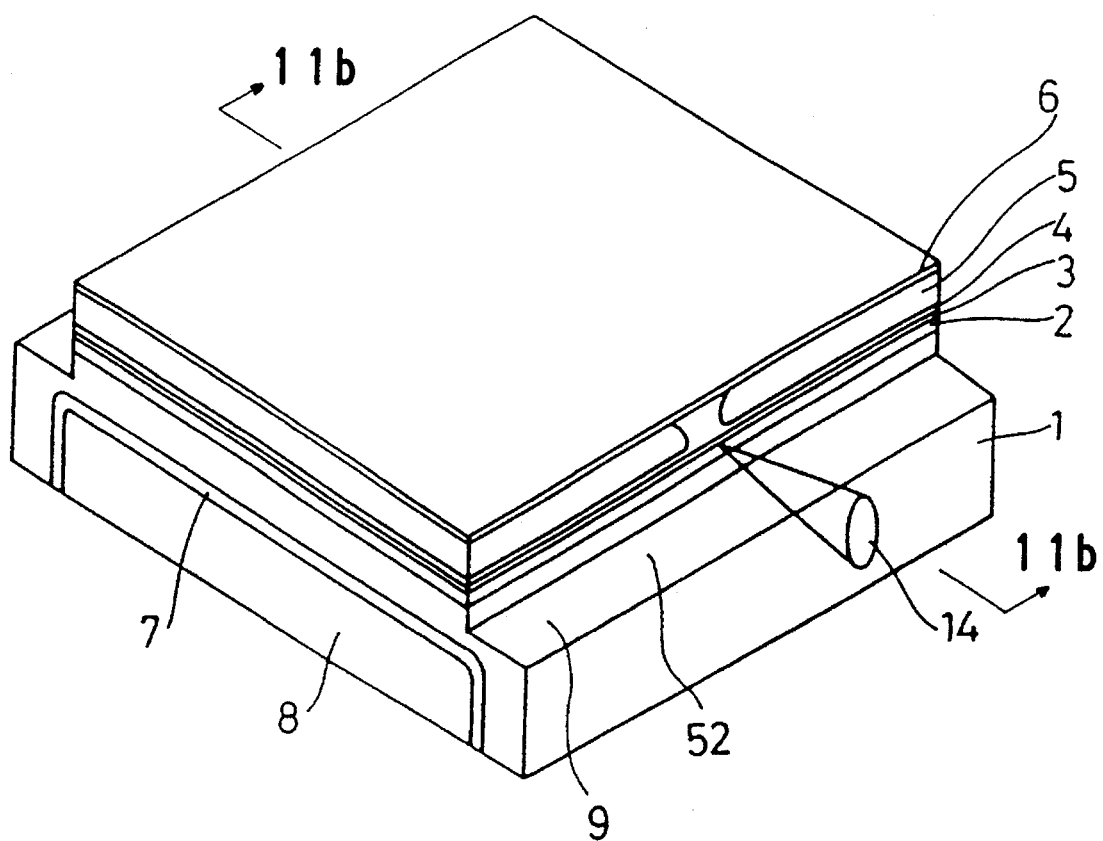
FIG. 13 is a perspective view illustrating a semiconductor laser diode in accordance with an eleventh embodiment of the present invention.

FIG. 13 is a perspective view illustrating a semiconductor laser diode of selective PHS structure in accordance with an eleventh embodiment of the present invention. In the figure, the same reference numerals as those of FIG. 11 designate the same or corresponding parts. Reference numeral 52 designates a step part produced by walls including a wall of the laser resonator facet and an upper wall of the substrate shoulder part. The step part 52 is formed along the whole width of the laser device. Similarly to the hollowed portion 51 of the above-described ninth embodiment, the depth of the step part 52 from the active layer 3 is larger than the width of the laser beam 14 broadening in the thickness direction of the substrate so that the laser beam 14 emitted from the resonator facet with a specific beam broadening angle does not strike the substrate shoulder part 9. The cross section taken along a line 11b—11b of FIG. 13 is illustrated in FIG. 11(b) and is similar to the ninth embodiment.

In this eleventh embodiment, similarly to the ninth embodiment, as illustrated in FIG. 11(b), the PHS electrode length also satisfies the relation of A≦B, supposing that the resonator length 12 is A and the PHS electrode length 13 is B. Therefore, similarly to the first embodiment, the heat radiating characteristic is improved, and the lifetime of the laser diode is also improved.

Twelfth Embodiment

Figure 14:
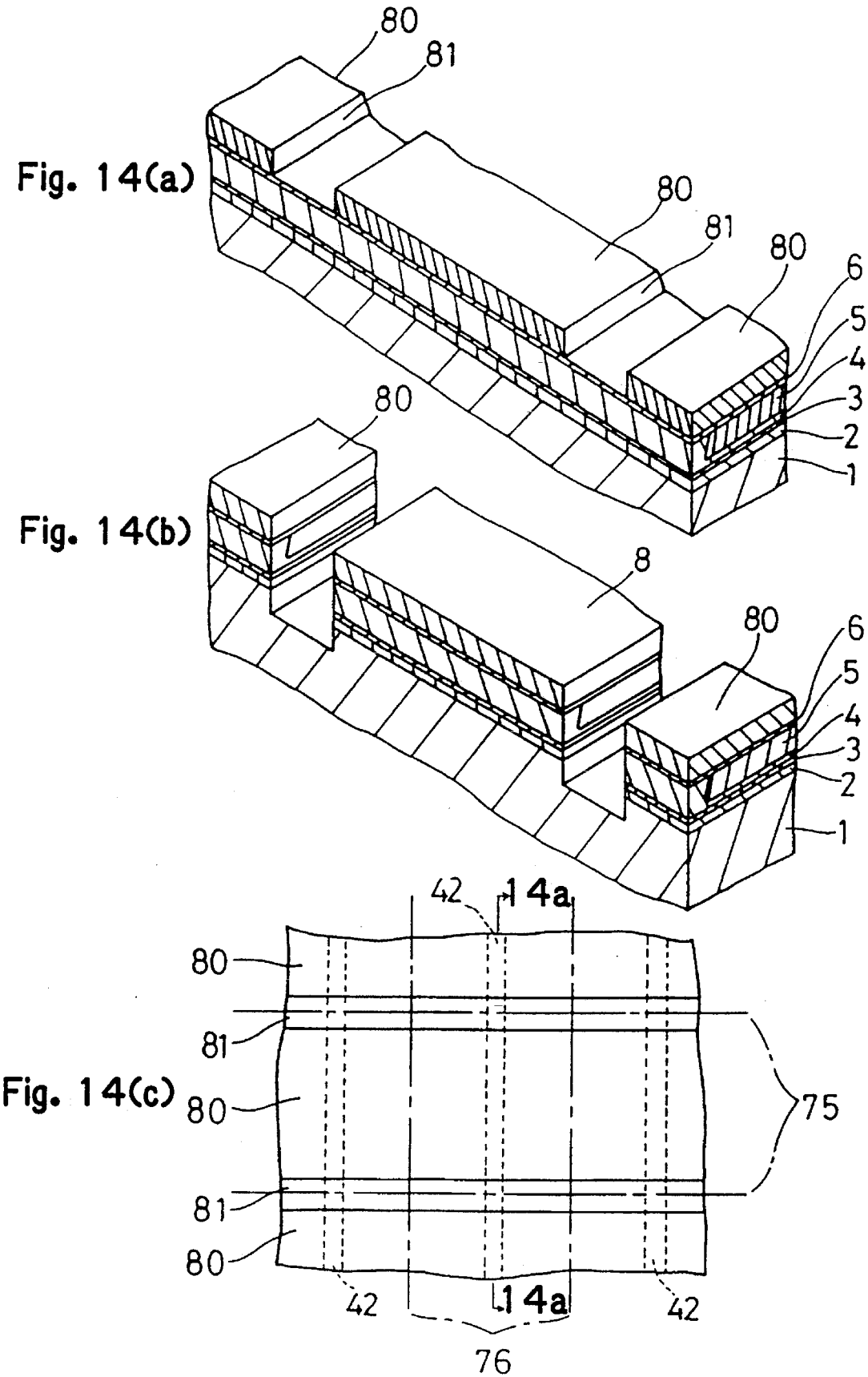
FIGS. 14(a) to 14(c) are diagrams illustrating process steps of a method for producing a semiconductor laser diode in accordance with a twelfth embodiment of the present invention.

FIGS. 14(a) and 14(b) are diagrams illustrating process steps of a method for producing a selective PHS structure semiconductor laser diode in accordance with a twelfth embodiment of the present invention. The production method of the selective PHS structure semiconductor laser diode in accordance with this twelfth embodiment is employed for producing the selective PHS structure semiconductor laser diode of the above-described eleventh embodiment.

Next, a description will be given with reference to these drawings of the process steps for producing the selective PHS structure semiconductor laser diode in accordance with the twelfth embodiment.

The process step for producing, on the substrate 1, the semiconductor active region comprising the first cladding layer 2, the active layer 3, the second cladding layer 4, the current blocking layer 5 and the contact layer 6 is exactly the same as the step of the fifth embodiment illustrated in FIG. 5(a). Then, as shown in FIG. 14(a), a resist pattern 80 having an opening 81 in a region where the resonator facet is to be formed, is deposited on the contact layer 6. FIG. 14(c) is a top plan view of the wafer in this state. While in the ninth embodiment the openings 71 of the resist pattern 70 are formed corresponding to the positions of the ridge stripe 42, the stripe shape openings 81 extending in the direction perpendicular to the ridge stripe 42 are formed in the region where the resonator facet is to be formed. Therefore, mask alignment in patterning the photoresist is carried out easier than in the tenth embodiment. In FIG. 14(c), reference numeral 75 designates a device dividing line in the resonator length direction, and numeral 76 designates a device dividing line in the device width direction.

Next, by anisotropically etching the semiconductor active region and the semiconductor substrate, such as by RIE, utilizing the resist pattern 80 as a mask, as shown in FIG. 14(b), a laser resonator facet perpendicular to the wafer surface is formed. Then, the n-side ohmic electrode 7 and the PHS electrode 8 are formed by the exactly same steps as those of the fifth embodiment illustrated in FIG. 5(d) and 5(e) and FIG. 6(a). Finally, by cleaving along the device dividing lines 75 and dicing along the device dividing lines 76 shown in FIG. 14(c), the completed semiconductor laser device illustrated in FIG. 13 is obtained.

In this twelfth embodiment, the structure for preventing the laser beam from being reflected by the resonator facet and the substrate shoulder part, are produced by one time dry etching, and mask alignment in patterning the photoresist is carried out easier than in the tenth embodiment, simplifying production of a selective PHS structure semiconductor laser diode that has an improved heat radiating characteristic at the laser beam emitting facet and the laser beam of a normal spot.

Thirteenth Embodiment

Figure 15:
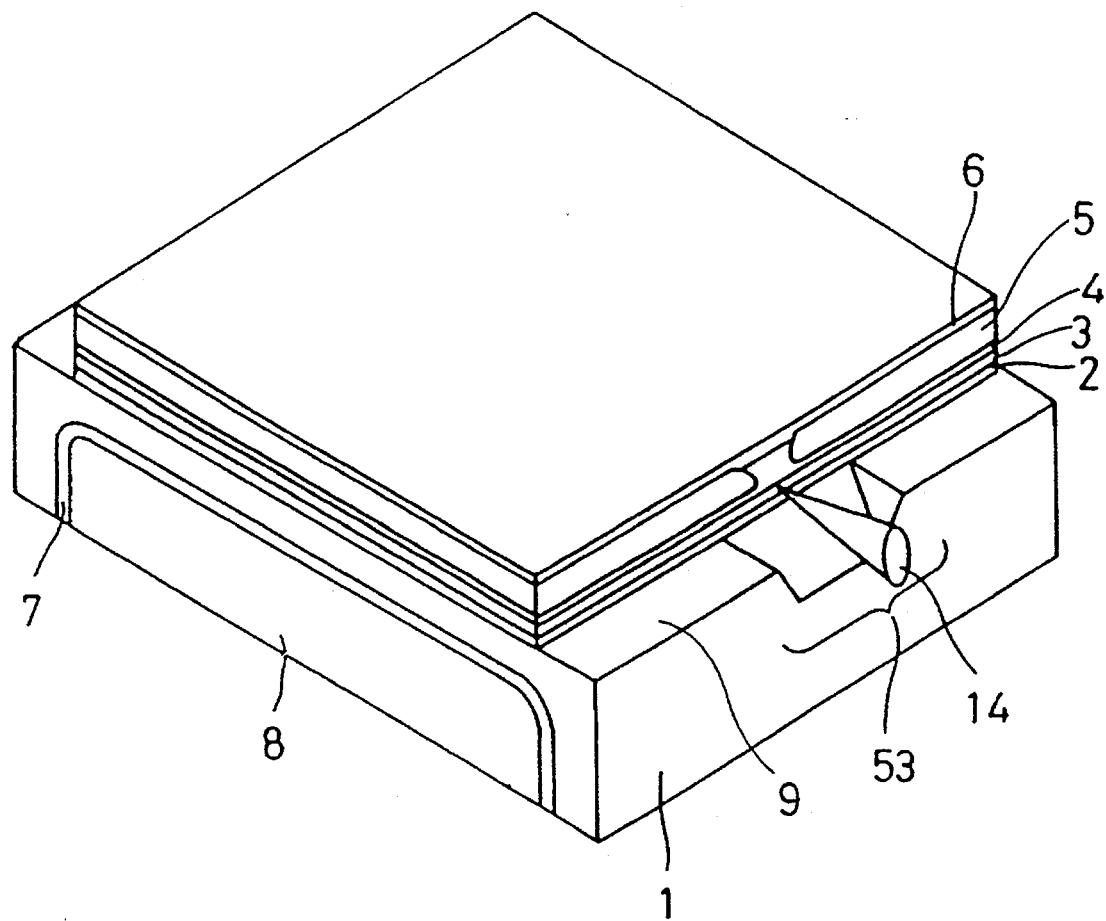
FIG. 15 is a perspective view illustrating a semiconductor laser diode in accordance with a thirteenth embodiment of the present invention.

FIG. 15 is a perspective view illustrating a semiconductor laser diode of selective PHS structure in accordance with a thirteenth embodiment of the present invention. In the figure, reference numeral 53 designates a tapered portion at the center of the step part. In the first embodiment the substrate shoulder part 9 is tapered over the whole width of the device so that the laser beam 14 is not reflected at the n-type GaAs substrate 1. In this thirteenth embodiment, a portion of the substrate shoulder part which is wider than the beam broadening of the laser beam 14 is tapered to prevent the laser beam from being reflected. The structures of other parts are the same as those of the first embodiment. As a result, similarly to the first embodiment, a selective PHS structure semiconductor laser diode having improved heat radiating characteristics and a normal light spot is obtained.

The semiconductor laser diode of this thirteenth embodiment is produced by the same process steps as those of the fifth embodiment. However, in the etching step, a mask pattern different from that of the fifth embodiment is employed. More specifically, the configuration of the resist mask used in the taper etching of FIG. 5(b), is made a configuration such as the resist pattern 70 having the opening 71 only in a portion corresponding to the ridge stripe as in the tenth embodiment shown in FIGS. 12(a) to 12(c). In addition, the configuration of the resist mask used in the anisotropic etching of FIG. 5(c) is made a configuration such as the resist pattern 80 having the stripe shape opening 81 extending in the direction perpendicular to the ridge stripe as in the twelfth embodiment shown in FIGS. 14(a) to 14(c).

Fourteenth Embodiment

Figure 16:
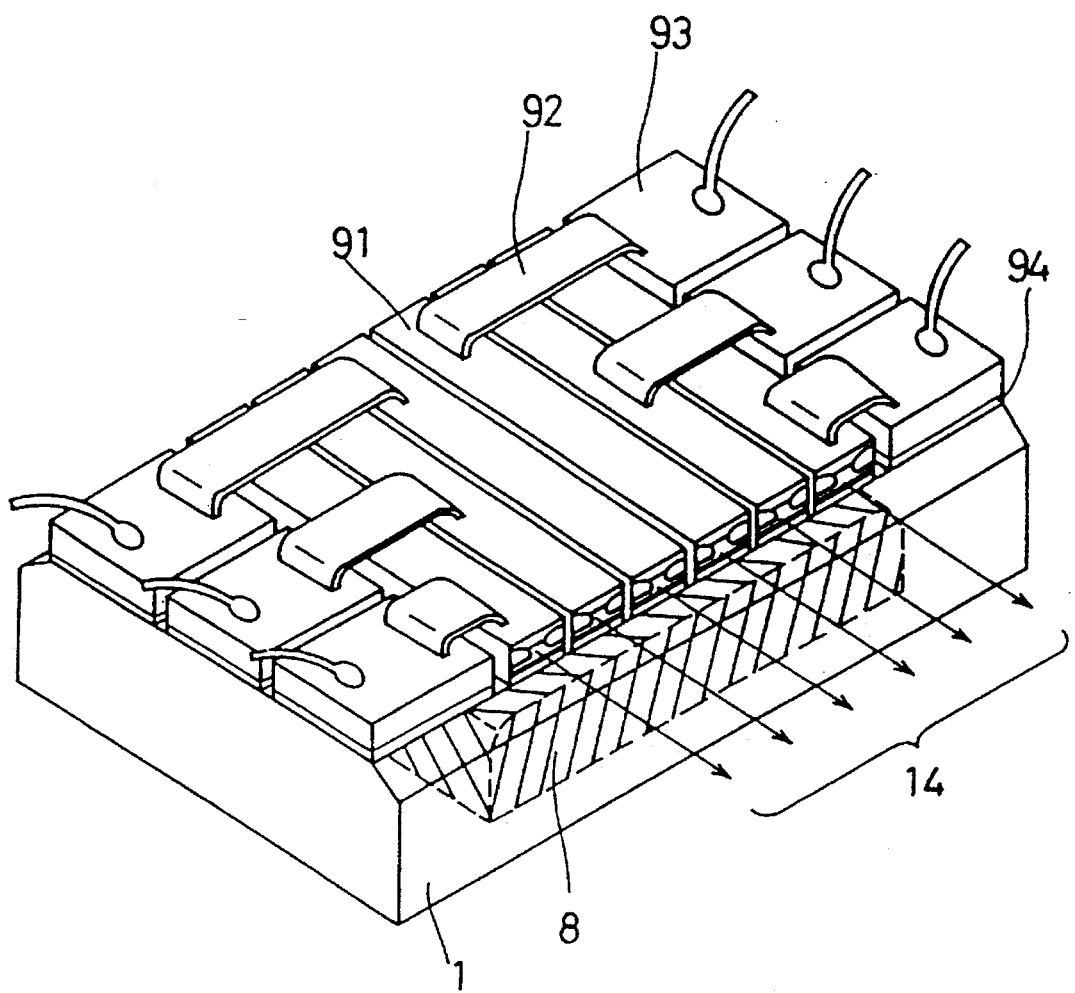
FIG. 16 is a perspective view schematically illustrating a semiconductor laser diode array in accordance with a fourteenth embodiment of the present invention.
Figure 17:
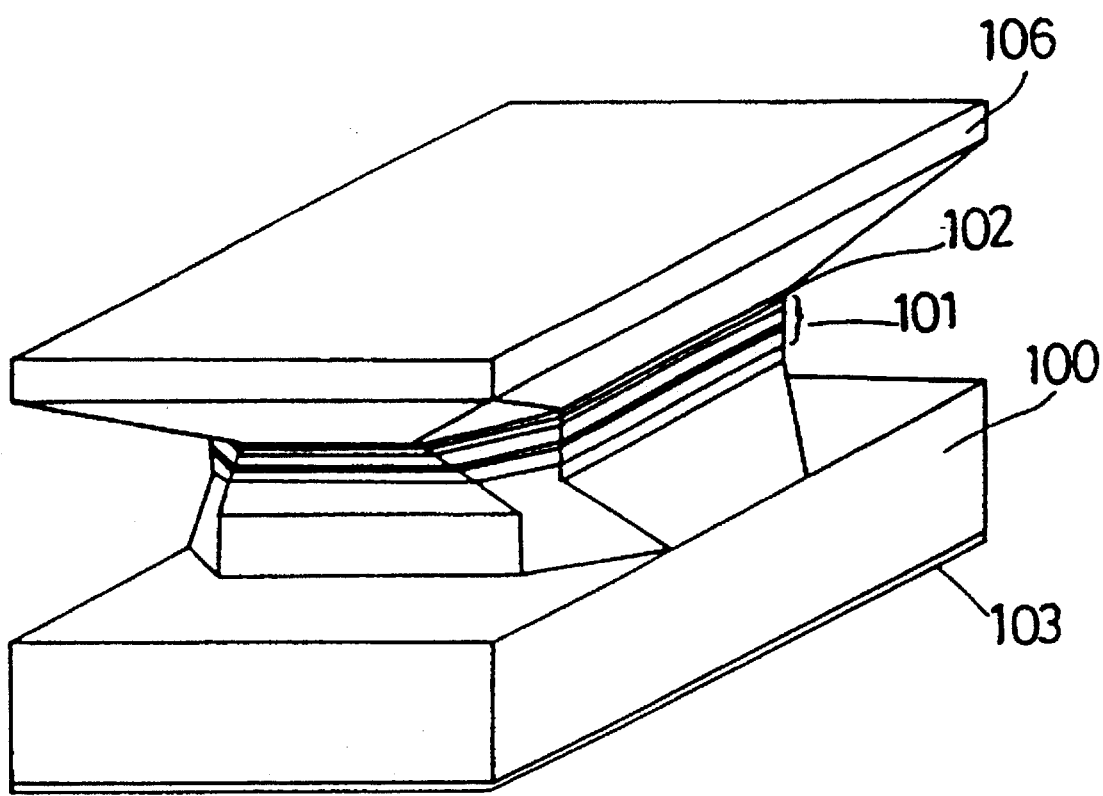
FIG. 17 is a perspective view for explaining the prior art semiconductor laser diode having a PHS structure.
Figure 18A:
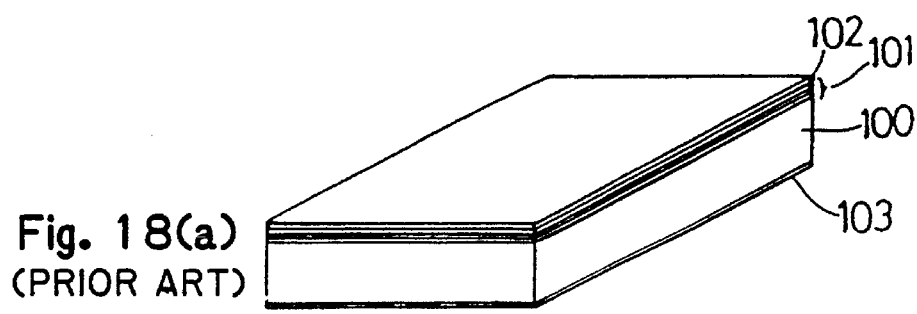
FIGS. 18(a) to 18(e) are perspective views illustrating process steps of a method for producing the semiconductor laser diode of PHS structure of FIG. 17.
Figure 18B:
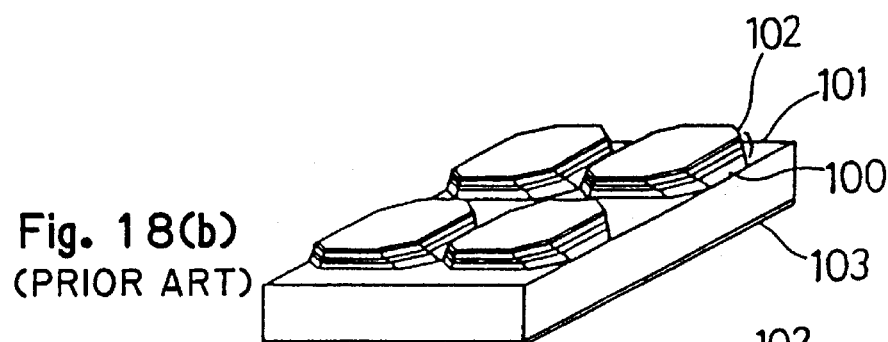
Figure 18C:
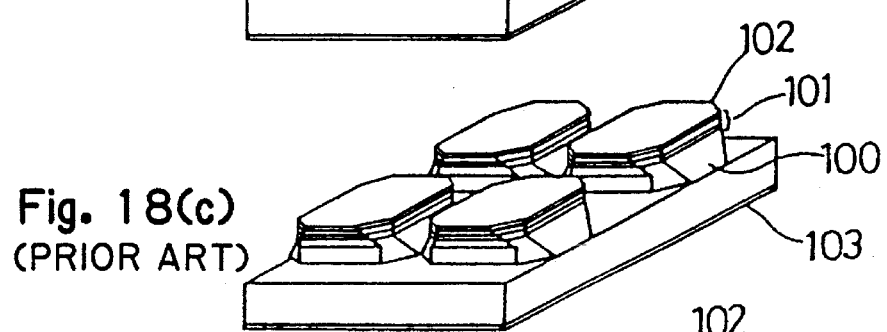
Figure 18D:
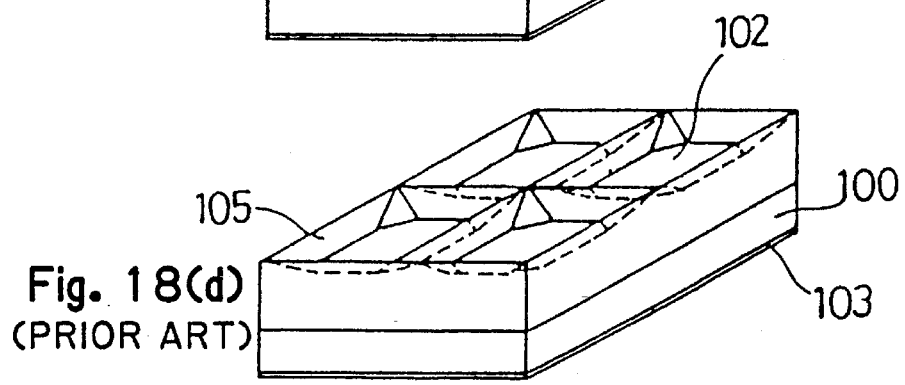
Figure 18E:
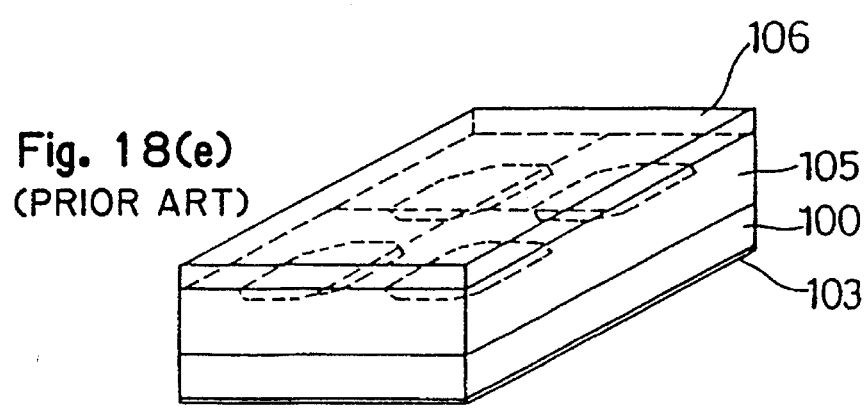

FIG. 16 is a perspective view schematically illustrating a semiconductor laser diode array of selective PHS structure in accordance with a fourteenth embodiment of the present invention. In the figure, reference numeral 91 designates a semiconductor laser, numeral 92 designates an airbridge wiring, and numeral 93 designates a bonding pad.

As shown in the figure, the semiconductor laser diode array of this fourteenth embodiment is monolithically fabricated by disposing six laser diodes 91 in parallel with each other, the diodes having the same fundamental structure as that of the selective PHS structure semiconductor laser diode of the first embodiment illustrated in FIG. 1. Respective semiconductor lasers are produced on the n-type GaAs substrate 1 separated by mesa etching, and the p-side electrodes of the respective semiconductor lasers are electrically separated, while the n-side electrode is common to all the semiconductor lasers. The n-side electrode comprises the n-side ohmic electrode 7 and the PHS electrode 8. In the resonator length direction, the PHS electrode length satisfies the relation of $A \leq B$, supposing that the resonator length is A and the PHS electrode length is B. In the direction perpendicular to the resonator length direction, the PHS electrode 8 is formed in a region including all of the six semiconductor lasers. Further, the bonding pads 93 are disposed on an insulating film 94 on the n-type GaAs substrate 1 and are electrically connected with the p-side electrodes of the respective semiconductor lasers via airbridge wirings 92.

As the semiconductor laser diode array having a selective PHS structure has a structure as described above, the heat generated by the semiconductor lasers is diffused speedily to the PHS electrode, preventing deterioration of the laser characteristics by thermal crosstalk. In addition, since the semiconductor laser diode array is mounted by the junction-up mounting, it is easily possible to form the p-side electrode independently for each laser diode, realizing an ideal structure as an array laser. As a result, an array laser having the lifetime equivalent to that of the single laser is obtained.

Fifteenth Embodiment

Description will be given of a fifteenth embodiment of the present invention.

In the fourteenth embodiment, the fundamental structures of the respective semiconductor lasers, i.e., the structure of the laser active region, that of the PHS electrode, and that for preventing the emitted laser beam from being reflected by the substrate shoulder part, are the same as those of the selective PHS structure semiconductor laser diode in accordance with the first embodiment shown in FIG. 1, and the semiconductor laser diodes are monolithically disposed in an array. Here, it is also possible that the structure of the PHS electrode of the fourth embodiment, or the structures for preventing the emitted laser beam from being reflected by the substrate shoulder part of the ninth, the eleventh, or the thirteenth embodiment can be employed in the fifteenth embodiment. The PHS electrode may be formed for each semiconductor laser of the array laser. However, the structure of the fourteenth embodiment is superior to this independent PHS electrode structure in heat radiating characteristic.

While the basic structure of a ridge type laser diode is employed in the first to the fifteenth embodiments, the present invention can be applied to a laser diode of other structure such as an electrode stripe laser or a self-aligned structure laser (SAS laser), realizing the same effects as described above.

What is claimed is:

1. A semiconductor laser diode having a selective PHS structure comprising:

a semiconductor substrate having opposite first and second main surfaces, side surfaces transverse to the first and second main surfaces, and front and rear surfaces transverse to the first and second main surfaces and the side surfaces;

a laser diode structure disposed on the first main surface having a resonator and opposed front and rear facets with a length lying along a resonator length direction transverse to the facets; and a PHS electrode selectively buried in said substrate at the second main surface wherein said laser diode structure is located in an area defined by a first pair of parallel lines running in a direction perpendicular to the resonator length direction and a second pair of parallel lines located at the side surfaces of said semiconductor substrate, the first pair of lines being located internally of the front and rear surfaces of said semiconductor substrate, and said PHS electrode has a length in the resonator length direction no shorter than the resonator length.

2. The semiconductor laser diode of claim 1 wherein a portion of said semiconductor substrate adjacent one of the front and rear facets is tapered so that the laser beam does not strike said semiconductor substrate.

3. The semiconductor laser diode of claim 1 wherein a hollowed portion is provided adjacent one of the facets so that the laser beam does not strike said semiconductor substrate.

4. A semiconductor laser diode having a selective PHS structure including a semiconductor substrate having opposite first and second surfaces and side surfaces transverse to the first and second surfaces, and opposed front and rear facets transverse to a resonator length direction, a plurality of laser diode structures on the first surface including respective active regions and resonators along a resonator length direction, and a PHS electrode selectively buried in the second surface wherein said active regions of said laser diode structures are located in an area defined by a first pair of parallel lines running in a direction perpendicular to a resonator length direction and a second pair of parallel lines located at the side surfaces of said semiconductor substrate, said first pair of lines being located internally of the front and rear facets, and said PHS electrode has a length in the resonator length direction no shorter than said active regions in the resonator length direction.

* * * * *